(12) United States Patent
Shore

(10) Patent No.: US 6,958,945 B2
(45) Date of Patent: Oct. 25, 2005

(54) DEVICE HAVING A MEMORY ARRAY STORING EACH BIT IN MULTIPLE MEMORY CELLS

(75) Inventor: Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/928,380

(22) Filed: Aug. 27, 2004

(65) Prior Publication Data

US 2005/0024970 A1 Feb. 3, 2005

Related U.S. Application Data

(60) Continuation of application No. 10/395,478, filed on Mar. 24, 2003, now Pat. No. 6,853,601, which is a continuation of application No. 10/189,138, filed on Jul. 2, 2002, now Pat. No. 6,538,949, which is a continuation of application No. 09/886,762, filed on Jun. 21, 2001, now Pat. No. 6,442,094, which is a continuation of application No. 09/618,816, filed on Jul. 18, 2000, now Pat. No. 6,285,618, which is a continuation of application No. 09/015,541, filed on Jan. 29, 1998, now Pat. No. 6,122,213, which is a division of application No. 08/775,510, filed on Dec. 31, 1996, now Pat. No. 5,781,483.

(51) Int. Cl.⁷ .................................................. G11C 7/00
(52) U.S. Cl. .................. 365/222; 365/200; 365/230.04; 365/230.06
(58) Field of Search ................................. 365/149, 200, 365/201, 230.04, 230.06, 222

(56) References Cited

U.S. PATENT DOCUMENTS

| | | |
|---|---|---|
| 4,459,685 A | 7/1984 | Sud et al. |
| 4,601,019 A | 7/1986 | Shah et al. |
| 5,144,584 A | 9/1992 | Hoshino |
| 5,291,443 A | 3/1994 | Lim |
| 5,339,273 A | 8/1994 | Taguchi |
| 5,373,475 A | 12/1994 | Nagase |
| 5,381,368 A | 1/1995 | Morgan et al. |
| 5,422,850 A | 6/1995 | Sukegawa et al. |
| 5,440,517 A | 8/1995 | Morgan et al. |
| 5,461,587 A | 10/1995 | Oh |
| 5,469,393 A | 11/1995 | Thomann |
| 5,471,430 A | 11/1995 | Sawada et al. |
| 5,502,675 A | 3/1996 | Kohno et al. |
| 5,528,539 A | 6/1996 | Ong et al. |
| 5,555,212 A | 9/1996 | Toshiaki et al. |
| 5,592,428 A | 1/1997 | Harrand et al. |
| 5,689,465 A | 11/1997 | Sukegawa et al. |
| 5,689,467 A | 11/1997 | Hashimoto |
| 5,724,286 A | 3/1998 | Gillingham |
| 5,754,486 A | 5/1998 | Nevill et al. |
| 5,781,483 A | 7/1998 | Shore |
| 5,793,694 A | 8/1998 | Akiba et al. |
| 5,818,784 A | 10/1998 | Muranaka et al. |
| 5,862,095 A | 1/1999 | Takahashi et al. |
| 5,953,266 A | 9/1999 | Shore |
| 5,966,334 A | 10/1999 | Shore |
| 6,023,432 A | 2/2000 | Shore |
| 6,044,029 A | 3/2000 | Shore |
| 6,075,743 A | 6/2000 | Barth et al. |
| 6,104,650 A | 8/2000 | Shore |
| 6,115,299 A | 9/2000 | Shore |
| 6,122,213 A | 9/2000 | Shore |
| 6,285,618 B1 | 9/2001 | Shore |
| 6,442,094 B2 | 8/2002 | Shore |
| 6,538,949 B2 | 3/2003 | Shore |
| 6,594,173 B2 * | 7/2003 | Keeth .......................... 365/63 |

* cited by examiner

Primary Examiner—Son Mai
(74) Attorney, Agent, or Firm—TraskBritt

(57) ABSTRACT

A memory array is provided, having at least two memory cells accessed for each row address to retain a sufficient electric charge to properly store "1" and "0" bits. For such a memory array, both even and odd row decoders in the array are permanently enabled so that each row address the array receives causes the even row decoder to energize at least one even word line and the odd row decoder to energize at least one odd word line. As a result, at least two memory cells are accessed for each row address so that each "1" or "0" bit is stored as an electric charge in at least two memory cells.

97 Claims, 6 Drawing Sheets

DEVICE HAVING A MEMORY ARRAY STORING EACH BIT IN MULTIPLE MEMORY CELLS

CROSS-REFERENCE TO RELATED APPLICATIONS

This application is a continuation of application Ser. No. 10/395,478, filed Mar. 24, 2003, now U.S. Pat. No. 6,853,601, issued Feb. 8, 2005, which is a continuation of application Ser. No. 10/189,138, filed Jul. 2, 2002, now U.S. Pat. No. 6,538,949, issued Mar. 25, 2003, which is a continuation of application Ser. No. 09/886,762, filed Jun. 21, 2001, now U.S. Pat. No. 6,442,094, issued Aug. 27, 2002, which is a continuation of application Ser. No. 09/618,816, filed Jul. 18, 2000, now U.S. Pat. No. 6,285,618, issued Sep. 4, 2001, which is a continuation of application Ser. No. 09/015,541, filed Jan. 29, 1998, now U.S. Pat. No. 6,122,213, issued Sep. 19, 2000, which is a divisional of application Ser. No. 08/775,510, filed Dec. 31, 1996, now U.S. Pat. No. 5,781,483, issued Jul. 14, 1998.

BACKGROUND OF THE INVENTION

1. Field of the Invention

The present invention relates in general to memory array repair and, in particular, to devices and methods for repairing memory arrays, such as dynamic random access memory arrays, by storing each individual bit in multiple memory cells in the arrays.

2. State of the Art

In general, Dynamic Random Access Memory (DRAM) arrays store digital information in the form of "1" and "0" bits by storing the bits as electric charges on capacitors. DRAM arrays then retrieve the stored bits by discharging their representative electric charges to a conductor, such as a digit line, and then detecting a change in voltage on the conductor resulting from the discharge. When any of the capacitors in a DRAM array are unable to store a sufficient electric charge to cause a detectable change in voltage on a conductor when discharged to the conductor, any "1" or "0" bits stored as electric charges on those capacitors cannot be retrieved by the array. In this circumstance, the array must be repaired by replacing the failing capacitors with redundant capacitors in redundant rows or columns in the array. If too many of the redundant capacitors also fail, then the array must be discarded.

More specifically, a conventional DRAM array 10 shown in FIG. 1 stores digital information in the form of "1" and "0" bits by storing the bits as electric charges on storage capacitors 12, 14, and 16 in memory cells 18, 20, 22 and 24 arranged along word lines (i.e., rows) WL0, WL1, . . . , and WLm and complementary pairs of digit lines (i.e., columns) D0 and D0*, D1 and D1*, . . . , and Dn and Dn*. Of course, while the DRAM array 10 is shown in FIG. 1 as having only nine memory cells in order to simplify description, the DRAM array 10 typically includes thousands or millions of memory cells.

The DRAM array 10 stores a "1" bit in the memory cell 18, for example, by energizing the word line WL0 to activate an NMOS transistor 26. The DRAM array 10 then applies a "1" bit voltage equal to a supply voltage $V_{CC}$ (e.g., 3.3 Volts) to the digit line D0, causing current to flow from the digit line D0, through the activated NMOS transistor 26 and the storage capacitor 12, and to a cell plate voltage DVC2 typically equal to one half the supply voltage $V_{CC}$. As this current flows, the storage capacitor 12 stores positive electric charge received from the digit line D0, causing a voltage $V_{S1}$ on the storage capacitor 12 to increase. When the voltage $V_{S1}$ on the storage capacitor 12 equals the "1" bit voltage on the digit line D0, current stops flowing through the storage capacitor 12. A short time later, the DRAM array 10 de-energizes the word line WL0 to de-activate the NMOS transistor 26 and isolate the storage capacitor 12 from the digit line D0, thereby preventing the positive electric charge stored on the storage capacitor 12 from discharging back to the digit line D0.

Similarly, the DRAM array 10 stores a "0" bit in the memory cell 20, for example, by energizing the word line WL1 to activate an NMOS transistor 28. The DRAM array 10 then applies a "0" bit voltage approximately equal to a reference voltage $V_{SS}$ (e.g., 0.0 Volts) to the digit line D0, causing current to flow from the cell plate voltage DVC2, through the storage capacitor 14 and the activated NMOS transistor 28, and to the digit line D0. As this current flows, the storage capacitor 14 stores negative electric charge received from the digit line D0, causing a voltage $V_{S2}$ on the storage capacitor 14 to decrease. When the voltage $V_{S2}$ equals the "0" bit voltage on the digit line D0, current stops flowing through the storage capacitor 14. A short time later, the DRAM array 10 de-energizes the word line WL1 to de-activate the NMOS transistor 28 and isolate the storage capacitor 14 from the digit line D0, thereby preventing the negative electric charge stored on the storage capacitor 14 from discharging back to the digit line D0.

The DRAM array 10 stores "1" and "0" bits in the memory cells 22 arranged along the complementary digit lines D0*, D1*, . . . , and Dn* in a manner similar to that described above, with the exception that the "1" bit voltage for these cells is approximately equal to the reference voltage $V_{SS}$ and the "0" bit voltage equals the supply voltage $V_{CC}$.

The DRAM array 10 retrieves "1" and "0" bits stored in the manner described above in the memory cells 18, 20, 22, and 24 by discharging electric charges stored on the storage capacitors 12, 14, and 16 to the digit lines D0, D0*, D1, D1*, . . . , Dn, and Dn* and then detecting a change in voltage on the digit lines D0, D0*, D1, D1*, . . . , Dn, and Dn* resulting from the discharge with sense amplifiers (0), (1), . . . , and (n).

For example, the DRAM array 10 retrieves the "1" bit stored in the memory cell 18 by first equilibrating the voltages on the digit lines D0 and D0* to the cell plate voltage DVC2. The DRAM array 10 then energizes the word line WL0 to activate the NMOS transistor 26, causing the positive electric charge stored on the storage capacitor 12 to discharge through the activated NMOS transistor 26 to the digit line D0. As the positive electric charge discharges, the voltage on the digit line D0 rises by an amount $V_{SENSE}$ calculated as follows:

$$V_{SENSE}=(V_S-DVC2)*C_S/(C_D+C_S)$$

where $V_S$ is the voltage $V_{S1}$ on the storage capacitor 12, $C_S$ is the capacitance of the storage capacitor 12, and $C_D$ is the capacitance of the digit line D0. When the rise in voltage $V_{SENSE}$ on the digit line D0 causes a difference in voltages between the digit lines D0 and D0* to exceed a detection threshold (typically about 150 mVolts) of the sense amplifier (0), the sense amplifier (0) responds by driving the voltage on the digit line D0 to the supply voltage $V_{CC}$ and by driving the voltage on the digit line D0* approximately to the reference voltage $V_{SS}$. Input/output gating circuitry, DC sense amplifiers, and an output buffer (not shown) then transmit these voltages from the digit lines D0 and D0* to external circuitry as a "1" bit.

Likewise, the DRAM array 10 retrieves the "0" bit stored in the memory cell 20, for example, by first equilibrating the voltages on the digit lines D0 and D0* to the cell plate voltage DVC2. The DRAM array 10 then energizes the word line WL1 to activate the NMOS transistor 28, causing the negative electric charge stored on the storage capacitor 14 to discharge through the activated NMOS transistor 28 to the digit line D0. As the negative electric charge discharges, the voltage on the digit line D0 falls by an amount $V_{SENSE}$, calculated as described above, where $V_S$ is the voltage $V_{S2}$ on the storage capacitor 14 and $C_S$ is the capacitance of the storage capacitor 14. When the drop in voltage $V_{SENSE}$ on the digit line D0 causes the difference in voltages between the digit lines D0 and D0* to exceed the detection threshold of the sense amplifier (0), the sense amplifier (0) responds by driving the voltage on the digit line D0 approximately to the reference voltage $V_{SS}$ and by driving the voltage on the digit line D0* to the supply voltage $V_{CC}$. The input/output gating circuitry, DC sense amplifiers, and output buffer then transmit these voltages from the digit lines D0 and D0* to external circuitry as a "0" bit.

The DRAM array 10 retrieves "1" and "0" bits from the memory cells 22 arranged along the complementary digit lines D0*, D1*, . . . , and Dn* in the same manner as described above.

DRAM arrays sometimes contain defective memory cells that are unable to reliably store "1" and "0" bits in the manner described above. In some instances, this occurs because the capacitance of the storage capacitors in these memory cells is too small, preventing the capacitors from retaining a sufficient electric charge to cause a change in voltage $V_{SENSE}$ on a digit line when discharged to the digit line that exceeds a sense amplifier's detection threshold. In other instances, this occurs because the electric charge stored on the storage capacitors in these memory cells leaks away through a variety of mechanisms, also preventing the capacitors from retaining a sufficient electric charge to cause a detectable change in voltage $V_{SENSE}$ on a digit line when discharged to the digit line. In either case, because the change in voltage $V_{SENSE}$ caused by discharging the electric charges stored by the storage capacitors in these memory cells cannot be detected by a sense amplifier, the "1" and "0" bits represented by the electric charges stored in these memory cells are irretrievable.

DRAM arrays are also sometimes unable to reliably store "1" and "0" bits in certain memory cells because the detection threshold of the cells' associated sense amplifier is too large for the sense amplifier to detect a change in voltage $V_{SENSE}$ caused by one of the cells discharging to the digit line. In this case as well, the "1" and "0" bits represented by the electric charges stored in these cells are irretrievable.

Generally, when DRAM arrays are found to be defective in this way, an attempt is made to repair the arrays by replacing defective memory cells and defective sense amplifiers in the arrays with redundant memory cells provided in redundant rows or columns in the arrays and with redundant sense amplifiers provided in the redundant columns.

Conventionally, when a redundant row is used to repair a DRAM array containing a defective memory cell, a row address that identifies the defective cell's row is permanently stored in the array by blowing selected fuses or anti-fuses in the array. Then, during normal operation of the DRAM array, if the array receives a request to access a memory cell having a memory address including a row address portion that corresponds to the stored row address, redundant circuitry in the array directs the array to access a redundant memory cell in the redundant row instead of accessing the memory cell identified by the received memory address. Since every memory cell in the defective cell's row has the same row address, every cell in the defective cell's row, both operative and defective, is replaced by a redundant memory cell in the redundant row.

Similarly, when a redundant column is used to repair a DRAM array containing a defective memory cell, a column address that identifies the defective cell's column is permanently stored in the array by blowing selected fuses or anti-fuses in the array. Then, during normal operation of the DRAM array, if the array receives a request to access a memory cell having a memory address including a column address portion that corresponds to the stored column address, redundant circuitry in the array directs the array to access a redundant memory cell in the redundant column instead of accessing the memory cell identified by the received memory address. Since every memory cell in the defective cell's column has the same column address, every cell in the defective cell's column, both operative and defective, is replaced by a redundant memory cell in the redundant column.

The process described above for repairing a DRAM array using redundant rows and column is well known in the art, and is described in various forms in U.S. Pat. Nos. 4,459,685, 4,601,019, 5,422,850 and 5,528,539.

Because the conventional repair process described above uses an entire redundant row or column to repair each defective memory cell in a DRAM or other memory array, the number of defective memory cells that can be repaired in an array is limited by the number of redundant rows or columns in the array which, in turn, is limited by the space available in the array for redundant rows or columns. As a result, it is not uncommon for defective DRAM and other memory arrays to be discarded because the conventional repair process cannot repair the quantity of defective memory cells they contain. This problem is often exacerbated by the discovery of defective redundant memory cells in the available redundant rows or columns. Obviously, it would be preferable to be able to repair these defective arrays rather that discard them.

Therefore, there is a need in the art for an improved device and method for repairing DRAM arrays and other memory arrays. Such an improved device and method should be applicable to arrays containing memory cells that are unable to reliably store "1" and "0" bits because the storage capacitors do not retain a sufficient electric charge, or because their associated sense amplifiers have a detection threshold that is too large.

BRIEF SUMMARY OF THE INVENTION

The present invention provides an apparatus for repairing a memory array, such as a DRAM array, that includes a pair of complementary digit lines through which memory cells activated by word lines selected in accordance with row addresses are accessed. The array may need repair, for example, when a memory cell in the array is unable to properly store "1" and "0" bits because the charge it retains representing a bit is not sufficient to cause a detectable change in voltage of the digit lines when discharged to the digit line.

When repair is needed, enabling circuitry (e.g., fuses or anti-fuses) in the apparatus enables repair of the array, and word line energizing circuitry (e.g., a row decoder) responsive to the enabling circuitry energizes more than one word line in the array in accordance with each row address so that more than one memory cell is accessed through the digit lines for each row address. As a result, the apparatus stores a single "1" or "0" bit as a charge in multiple memory cells. Then, when the apparatus retrieves the single bit, the bit's representative charges stored in the multiple memory cells are discharged to the digit lines to cause a change in voltage on the digit lines that is greater than and, therefore, more likely to be detectable than a change in voltage on the digit lines caused by discharging a representative charge stored in a single memory cell to the digit lines in the conventional manner.

In other embodiments of the present invention, a memory system, an integrated circuit die, and a semiconductor wafer include the repair apparatus and memory array described above. In another embodiment, an electronic system includes input, output, processor, and memory devices, and the memory device includes the repair apparatus and memory array described above.

In a further embodiment, the present invention provides an apparatus for repairing a memory array. The memory array is of the type in which stored bits are read by detecting a change in voltage between two conductors caused by sharing a charge stored in a memory cell in the array with one of the conductors. The apparatus repairs the array when some memory cells in the array cannot retain a sufficient charge to cause a detectable change in voltage on one of the conductors. The apparatus includes circuitry directing each memory cell in a group of cells in the array to store a charge representing a single stored bit and, when the single stored bit is being read, to share its stored charge with one of the conductors.

In a still further embodiment, the present invention provides an apparatus for repairing a memory array. The memory array is of the type in which stored bits are accessed by using sense amplifiers to detect a change in voltage between two conductors caused by sharing a charge stored in a memory cell in the array with one of the conductors. The apparatus repairs the array when some of the sense amplifiers in the array cannot detect a change in voltage on one of the conductors caused by sharing a charge stored in one of the memory cells with one of the conductors. The apparatus includes circuitry directing each memory cell in a group of cells in the array to store a charge representing a single stored bit and, when the single stored bit is being accessed, to share its stored charge with one of the conductors.

In an additional embodiment, a memory system includes a memory array including pairs of complementary digit lines, alternating even and odd word lines, and memory cells controlled by the word lines and accessed through the digit lines. Address buffers receive memory addresses and output corresponding row and column addresses, and row decoder circuitry energizes at least two word lines in accordance with each row address. A column decoder outputs a column select signal in accordance with each column address, and sense amplifier and input/output gating circuitry selects a pair of complementary digit lines in the array in accordance with each column select signal. As a result, two or more memory cells that are each controlled by one of the energized word lines are accessed through one of the selected digit lines. A data buffer provides communication between the accessed memory cells and external circuitry.

In a further embodiment, a memory system includes a memory array including pairs of complementary digit lines, word lines, and memory cells controlled by the word lines and accessed through the digit lines. Address buffers receive multiplexed memory addresses in the form of a first plurality of address bits followed in time by a second plurality of address bits. The address buffers also output a row address and a first portion of a column address corresponding to each memory address' associated first plurality of address bits, and output a second portion of the column address corresponding to each memory address' associated second plurality of address bits. Row decoder circuitry energizes at least two word lines in accordance with each row address, and a column decoder outputs a column select signal in accordance with the first and second portions of each column address. Sense amplifier and input/output gating circuitry selects a pair of complementary digit lines in the array in accordance with each column select signal so at least two memory cells controlled by the energized word lines are accessed through one of the selected digit lines. As a result, the accessed memory cells together may store or output a single memory bit to external circuitry. A data buffer provides communication between the accessed memory cells and external circuitry.

In a still further embodiment, a memory system includes a memory array including pairs of complementary digit lines, word lines, and memory cells controlled by the word lines and accessed through the digit lines. Row address bit terminals receive a first plurality of address bits associated with a non-multiplexed memory address, and column address bit terminals receive a second plurality of address bits associated with the non-multiplexed memory address. Address buffers output a row address corresponding to a first portion of the first plurality of address bits and output a column address corresponding to both the second plurality of address bits and a second portion of the first plurality of address bits. Row decoder circuitry energizes at least two word lines in accordance with the row address, and a column decoder outputs a column select signal in accordance with the column address. Sense amplifier and input/output gating circuitry selects a pair of complementary digit lines in the array in accordance with the column select signal. As a result, at least two memory cells controlled by the energized word lines are accessed through one of the selected digit lines. A data buffer provides communication between the accessed memory cells and external circuitry.

In a still additional embodiment, a method for storing a bit in a memory array having a plurality of memory cells each coupled to one of a pair of complementary digit lines includes providing a charge representing the bit on each of the digit lines, storing the charge provided on one of the digit lines in at least one of the memory cells, and storing the charge provided on one of the digit lines in at least one other of the memory cells.

In another embodiment, a method of testing a repair for a memory array of the type to store a bit by storing a charge in a memory cell, and also of the type to access the bit by sharing the stored charge with one of two conductors and then detecting a resulting change in voltage between the conductors, comprises: directing the memory cells in a group of memory cells in the memory array to each store the same bit by each storing a charge representing the bit; directing each memory cell in the group of memory cells to share its stored charge with one of the conductors; and attempting to detect a change in voltage between the conductors resulting from the memory cells in the group sharing their stored charges with the conductors.

DETAILED DESCRIPTION OF THE INVENTION

In general, the present invention provides an improved device and method for repairing Dynamic Random Access Memory (DRAM) arrays and other memory arrays. The device and method repair arrays that, for example, contain memory cells that are defective as a result of being unable to retain an electric charge representing a "1" or "0" bit that is sufficient to cause a detectable change in voltage on a digit line when discharged to the digit line.

The device and method store an electric charge representing an individual "1" or "0" bit in multiple memory cells in an array that share a pair of complementary digit lines. When a bit stored in this inventive manner is retrieved, the electric charges stored in the multiple memory cells are discharged to the pair of digit lines, causing a detectable change in voltage on the digit lines. The device and method thus "gang" memory cells together to repair an array.

Figure 1:
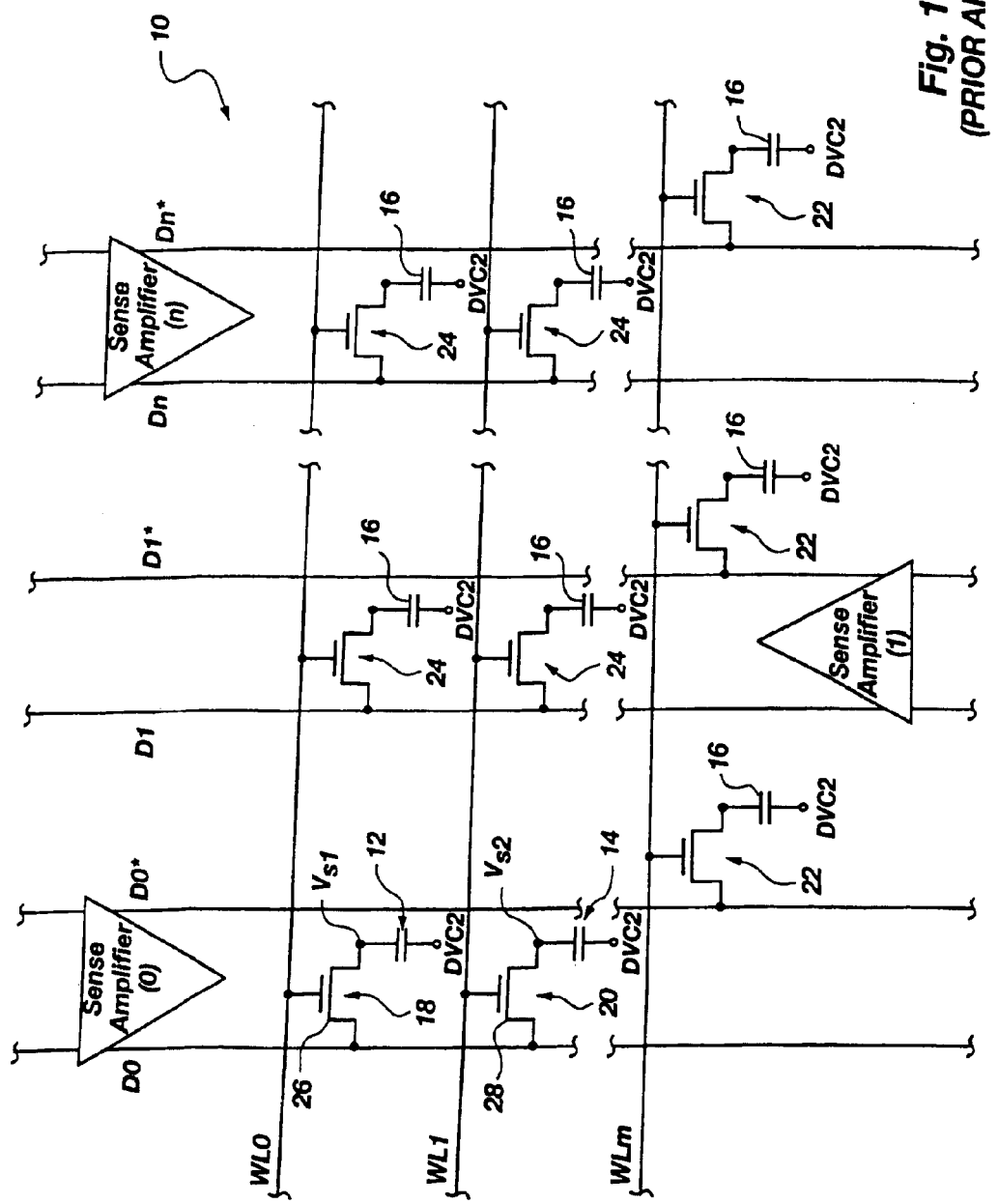
FIG. 1 is a schematic of a conventional dynamic random access memory array.
Figure 2:
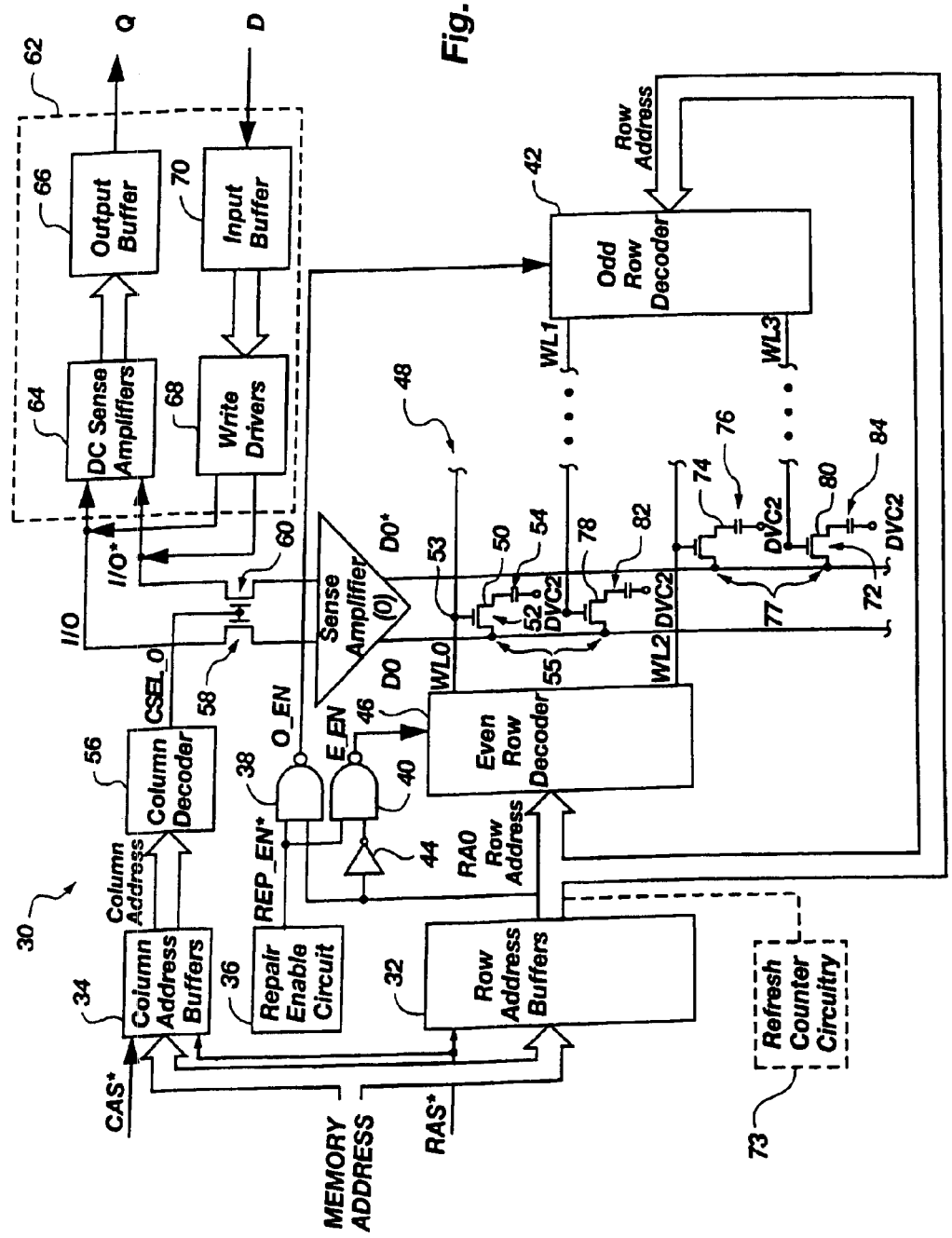
FIG. 2 is a block diagram and schematic of a memory system in accordance with the present invention.

More particularly, as shown in FIG. 2, an inventive memory system 30 includes row and column address buffers 32 and 34, respectively, receiving a multiplexed Memory Address, a row address strobe signal RAS*, and a column address strobe signal CAS*. It will be understood by those having skill in the field of this invention that the address buffers 32 and 34 may comprise any circuitry for buffering memory addresses, including, for example, pre-decoders and array buffers. Also, it will be understood that the present invention is applicable to memory systems receiving any number of address bits in any configuration, including both multiplexed and non-multiplexed addressing schemes. Further, as used herein, a "multiplexed" Memory Address is an address that is provided to a memory system in the form of a first plurality of address bits (e.g., the row address bits in a typical DRAM system) followed in time by a second plurality of address bits (e.g., the column address bits in a typical DRAM system).

The memory system 30 operates in both an unrepaired state and a repaired state. In its unrepaired state, in response to RAS* being activated, the row address buffers 32 operate in a well known manner to latch in a first plurality of address bits A0, A1, . . . , and Az from the Memory Address and then output a corresponding Row Address that includes row address bits RA0, RA1, . . . , RAz. A sense amplifier (0) also equilibrates voltages on a pair of complementary digit lines D0 and D0* to the cell plate voltage DVC2.

In addition, a repair enable circuit 36 is configured in the unrepaired state to allow normal operation of the memory system 30 by outputting a high, inactive repair enable signal REP_EN* to inputs of first and second NAND gates 38 and 40, respectively. As a result, when the row address bit RA0 is high, the first NAND gate 38 outputs a low, inactive odd row decoder enabling signal O_EN to disable an odd row decoder 42 and, at the same time, an inverter 44 outputs a low, causing the second NAND gate 40 to output a high, active even row decoder enabling signal E_EN to enable an even row decoder 46. The enabled even row decoder 46 then energizes one of a plurality of even word lines (i.e., rows) WL0 and WL2 in a DRAM array 48 selected in accordance with the row address bits RA1, . . . , RAz in a well known manner.

When, instead, the row address bit RA0 is low, the first NAND gate 38 outputs a high, active odd row decoder enabling signal O_EN to enable the odd row decoder 42 and, at the same time, the inverter 44 outputs a high, causing the second NAND gate 40 to output a low, inactive even row decoder enabling signal E_EN to disable the even row decoder 46. The enabled odd row decoder 42 then energizes one of a plurality of odd word lines WL1 and WL3 selected in accordance with the row address bits RA1, . . . , RAz in a well known manner.

As will be described in more detail below with respect to FIGS. 3A, 3B, and 3C, the repair enable circuit 36 may comprise any circuitry for enabling repair of an array, including, for example, fuses or anti-fuses. Also, as used herein, "configure," "configuring," and "configured," include both an affirmative act with respect to a circuit (e.g., blowing a fuse or an anti-fuse) and the absence of an affirmative act with respect to the circuit (e.g., not blowing a fuse or an anti-fuse). Further, it will be understood that the present invention is not limited to enabling circuitry including the repair enable circuit 36 and first and second NAND gates 38 and 40. Rather, the present invention includes within its scope any circuitry capable of enabling repair of an array. In addition, it will be understood that the row decoders 42 and 46 may comprise any word line energizing circuitry, including, for example, phase drivers and word line drivers. Still further, it will be understood that while only four word lines are shown in FIG. 2 for purposes of clarity, any number of word lines will work for purposes of the present invention. Also, it will be understood that while the present invention is described with respect to the DRAM array 48, the present invention is applicable to other memory arrays.

If, for example, the even word line WL0 is energized, as described above, in the unrepaired state of the memory system 30, the energized even word line WL0 activates an NMOS transistor 50 in a memory cell 52 in the DRAM array 48 through a control terminal 53 of the NMOS transistor 50. Of course, while the DRAM array 48 is shown in FIG. 2 as having only four memory cells for clarity, it will be understood that the DRAM array 48 includes millions of memory cells, and that the present invention is applicable to arrays including any number of memory cells.

As a result of the NMOS transistor 50 being activated, a storage capacitor 54 storing a positive electric charge representing a "1" bit, for example, is connected to the digit line D0 through the activated NMOS transistor 50 and an access terminal 55 (e.g., a digit line contact). Of course, while only one pair of complementary digit lines D0 and D0* and only one sense amplifier (0) are shown in FIG. 2 for clarity, it will be understood that the DRAM array 48 includes a multitude of digit lines and sense amplifiers, and that the present invention includes within its scope any number of digit lines and sense amplifiers.

When the storage capacitor 54 is connected to the digit line D0 through the activated NMOS transistor 50 and the access terminal 55, the storage capacitor 54 discharges its positive electric charge to the digit line D0. As a result, a voltage on the digit line D0 rises by $V_{SENSE}$ as calculated above. During the same period of time, in response to CAS* being activated, the column address buffers 34 operate in a well-known manner to latch in a second plurality of address bits A0, A1, . . . , and Az from the Memory Address and then output a corresponding Column Address to a column decoder 56.

If the positive electric charge stored in the storage capacitor 54 is sufficient for $V_{SENSE}$ to exceed a detection threshold of the sense amplifier (0), the sense amplifier (0) detects the change in voltage $V_{SENSE}$ and, in response, drives the digit line D0 to the supply voltage $V_{CC}$ and the digit line D0* approximately to the reference voltage $V_{SS}$. The column decoder 56 then energizes a column select signal CSEL_0 selected in accordance with the Column Address in a well-known manner, thereby activating a pair of input/output gating NMOS transistors 58 and 60. As a result, the voltages on the digit lines D0 and D0* are transferred through an input/output bus <I/O, I/O*> to a data buffer 62, including well-known DC sense amplifiers 64, an output buffer 66, write drivers 68, and an input buffer 70. The data buffer 62 then outputs the "1" bit as an output data signal Q to external circuitry (not shown). Of course, it will be understood that the present invention is not limited to data buffers including DC sense amplifiers, output buffers, write drivers, and input buffers.

If, instead, the positive electric charge stored in the storage capacitor 54 is insufficient for $V_{SENSE}$ to exceed the detection threshold of the sense amplifier (0), or the detection threshold of the sense amplifier (0) is too large, the sense amplifier (0) does not detect the change in voltage $V_{SENSE}$, and the voltages on the digit lines D0 and D0* do not separate as desired. As a result, the "1" bit (and any other bit) stored on the storage capacitor 54 is irretrievable, and the memory system 30 requires repair.

If only a few memory cells in the memory system 30 require repair, conventional methods using redundant rows and columns to replace these memory cells may work to repair the memory system 30. For example, the word line WL3 may comprise a redundant word line so that the failing memory cell 52 is replaced with a memory cell 72 along the word line WL3. However, as described above, conventional methods are not always successful.

Refresh counter circuitry 73, such as a CBR (CAS Before RAS) refresh counter, is operative in a well-known manner in the unrepaired state of the memory system 30.

Repair of the memory system 30 is enabled in accordance with the present invention by configuring the repair enable circuit 36 to output a low, active repair enable signal REP_EN* to inputs of the first and second NAND gates 38 and 40. As a result, the first NAND gate 38 outputs a high, active odd row decoder enabling signal O_EN to enable the odd row decoder 42. At the same time, the second NAND gate 40 also outputs a high, active even row decoder enabling signal E_EN to enable the even row decoder 46.

In the repaired state of the memory system 30, in response to RAS* being activated, the row address buffers 32 operate in the same well-known manner to latch in the first plurality of address bits A0, A1, . . . , and Az from the Memory Address and then output a corresponding Row Address that includes row address bits RA0, RA1, . . . , RAz. The sense amplifier (0) also equilibrates the voltages on the digit lines D0 and D0* to the cell plate voltage DVC2.

Because the even row decoder 46 is enabled in the repaired state of the memory system 30 as described above, it energizes an even word line WL0 or WL2 selected in accordance with the row address bits RA1, . . . , RAz. As a result, the NMOS transistor 50 or an NMOS transistor 74 is activated, connecting the storage capacitor 54 or a storage capacitor 76, respectively, to the respective digit line D0 or D0* through the activated NMOS transistor 50 or 74 and the access terminal 55 or an access terminal 77 (e.g., a digit line contact). At the same time, because the odd row decoder 42 is also enabled in the repaired state, it energizes an odd word line WL1 or WL3 also selected in accordance with the row address bits RA1, . . . , RAz. As a result, an NMOS transistor 78 or 80 is activated, connecting a respective storage capacitor 82 or 84 to the respective digit line D0 or D0* through the activated NMOS transistor 78 or 80 and the respective access terminal 55 or 77.

With two of the storage capacitors 54, 76, 82, and 84 each connected to one of the digit lines D0 and D0* as described above, the memory system 30 can store a "1" or "0" bit on the connected capacitors. To store a "1" bit, for example, received by the input buffer 70 as an input data signal D, the input buffer 70 directs the write drivers 68 to drive the input/output bus <I/O, I/O*> to the supply voltage $V_{CC}$ (I/O) and approximately to the reference voltage $V_{SS}$ (I/O*). During the same period of time, in response to CAS* being activated, the column address buffers 34 operate in the same well-known manner to latch in the second plurality of address bits A0, A1, . . . , Az from the Memory Address and output a corresponding Column Address to the column decoder 56. In response, the column decoder 56 energizes the column select signal CSEL_0 selected in accordance with the Column Address, thereby activating the input/output gating NMOS transistors 58 and 60 and conducting the input/output bus <I/O, I/O*> voltages to the sense amplifier (0). The sense amplifier (0) responds by driving the digit lines D0 and D0* to the respective supply voltage $V_{CC}$ and reference voltage $V_{SS}$. These voltages are then stored as described above on two of the storage capacitors 54, 76, 82, and 84 that are each connected to one of the digit lines D0 and D0*.

Of course, the memory system 30 can also retrieve a "1" or "0" bit stored on two of the storage capacitors 54, 76, 82, and 84. To do so, the even and odd row decoders 46 and 42, respectively, energize one of the even word lines WL0 and WL2 and one of the odd word lines WL1 and WL3 each selected in accordance with the row address bits RA1, . . . , RAz as described above. As a result, for example, positive electric charges representing a "1" bit stored on the storage capacitors 54 and 82 may discharge through respective NMOS transistors 50 and 78 activated by respective energized word lines WL0 and WL1. These discharging positive electric charges raise the voltage on the digit line D0 by $V_{SENSE}$ as described above, except that the rise in voltage $V_{SENSE}$ is greater than it would have been had the "1" bit been stored in the conventional manner as a charge on only one of the storage capacitors 54, 76, 82, and 84. This "greater" $V_{SENSE}$ is, of course, more likely to exceed the detection threshold of the sense amplifier (0) and to thereby be detected. As a result, the "1" bit may be successfully retrieved through the sense amplifier (0), the input/output gating NMOS transistors 58 and 60, the input/output bus <I/O, I/O*>, and the data buffer 62 in the manner described above. Thus, the memory system 30, including any previously defective memory cells, is repaired.

It should be understood that the present invention works with two or more memory cells connected to the same digit line D0 or D0*, for example, as described above, and with one or more memory cells connected to the digit line D0 and one or more memory cells connected to the digit line D0*. Further, it should be understood that while the memory system 30 has been described as including both odd and even row decoders 42 and 46, the present invention includes within its scope any decoding circuitry capable of energizing two or more word lines in accordance with each Memory Address. In addition, it should be understood that the present invention includes within its scope the energizing of a different number of word lines for different row addresses (e.g., energizing two word lines for a first row address and four word lines for a second row address). Such a scheme may be desirable where more memory cells are necessary to repair an array in some locations than in others.

It should also be understood that the memory system 30 has less total storage capacity in its repaired state than in its unrepaired state. For example, if the memory system 30 is provided in a 16-Megabit X 1 configuration in its unrepaired state, it has $2^{12}$ uniquely addressable word lines (i.e., rows) and $2^{12}$ uniquely addressable pairs of digit lines (i.e., columns) for a total of $2^{24}$ uniquely addressable locations (i.e., memory cells). If the memory system 30 is then repaired in accordance with the present invention by enabling the accessing of two memory cells for each received memory address, the repaired memory system 30 has $2^{11}$ uniquely addressable pairs of word lines and $2^{12}$ uniquely addressable pairs of digit lines for a total of $2^{23}$ uniquely addressable locations (i.e., pairs of memory cells). As a result, the repaired memory system 30 is in an 8-Megabit X 1 configuration. If, instead, the memory system 30 is repaired by enabling the accessing of four memory cells for each received memory address, the repaired memory system 30 has $2^{10}$ uniquely addressable groups of four word lines and $2^{12}$ uniquely addressable pairs of digit lines for a total of $2^{22}$ uniquely addressable locations (i.e., groups of four memory cells). As a result, the repaired memory system 30 is in 4-Megabit X 1 configuration. Of course, in order to enable the accessing of four memory cells for each received memory address, the even and odd row decoders 46 and 42 are each configurable with, for example, fuses or anti-fuses, to select and energize two word lines in accordance with each row address.

It will be understood that, as used herein, "accessing" a memory cell means energizing a conductor, such as a word line, connected to an access terminal of the cell, and then sensing a resulting change in voltage on the conductor using a sense amplifier. The term "accessing" thus includes both refreshing and reading a memory cell.

Since the 4-Megabit X 1 configuration produced in the above example by grouping four word lines together for each memory address is an industry standard configuration and the 8-Megabit X 1 configuration is not, it can be seen that it can be advantageous to group four word lines together when repairing the memory system 30 in accordance with the present invention. This allows 256-Megabit arrays to be recovered (i.e., repaired) as industry standard 64-Megabit arrays, 64-Megabit arrays to be recovered as industry standard 16-Megabit arrays, 16-Megabit arrays to be recovered as industry standard 4-Megabit arrays, 4-Megabit arrays to be recovered as industry standard 1-Megabit arrays, etc. Of course, the same advantageous principle applies to grouping sixteen, sixty-four, etc., word lines together when repairing the memory system 30 in accordance with the present invention.

Of course, 8-Megabit, 32-Megabit, 128-Megabit, etc., configurations can be useful, for example, in producing standard Single In-Line Memory Module (SIMM) upgrade configurations.

However, continuing with the above example, if the unrepaired memory system 30 having 16-Megabit X1 configuration is to be recovered in accordance with the present invention in a 4-Megabit X1 configuration, it is necessary that the column address buffers 34 continue to receive the twelve address bits with each memory address that they received in the 16-Megabit X1 configuration. This is because in both the unrepaired 16-Megabit X1 configuration and the repaired 4-Megabit X1 configuration, the memory system 30 has $2^{12}$ uniquely addressable pairs of digit lines. Allowing the column address buffers 34 to continue to receive twelve address bits in the repaired 4-Megabit X1 configuration can be problematic, though, because standard die packages for 4-Megabit X1 dice include only eleven address bit terminals.

Therefore, still continuing with the above example, in the repaired 4-Megabit X1 configuration, the column address buffers 34 in the memory system 30 are preferably configurable with, for example, fuses or anti-fuses, to latch in an address bit in the first eleven address bits from the Memory Address in response to RAS* being activated. At the same time, of course, the row address buffers 32 latch in the other ten address bits from the Memory Address in response to RAS* being activated in order to be able to uniquely address the $2^{10}$ groups of four word lines in the memory system 30. Later, in response to CAS* being activated, the column address buffers 34 latch in the second eleven address bits from the Memory Address in order to have a total of twelve address bits from the Memory Address to uniquely address the $2^{12}$ pairs of complementary digit lines in the memory system 30.

Of course, it should be understood that the refresh counter circuitry 73 of the memory system 30 may be configured with fuses, anti-fuses, or the like to output row addresses in the repaired state of the memory system 30, which correspond appropriately to those addresses output by the row address buffers 32.

Figure 3A:
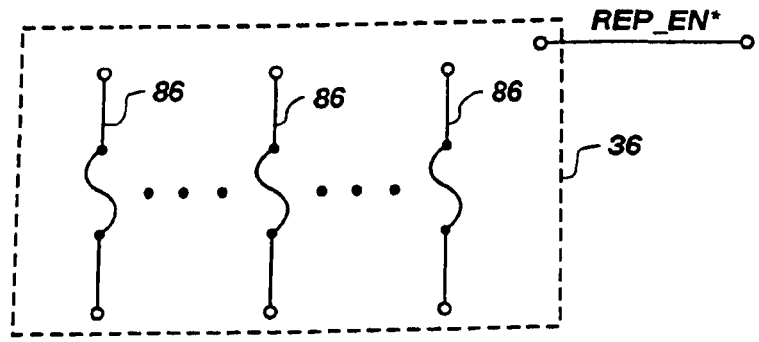
FIGS. 3A, 3B, and 3C are schematics of alternative versions of a repair enable circuit in the memory system of FIG. 2.
Figure 3B:
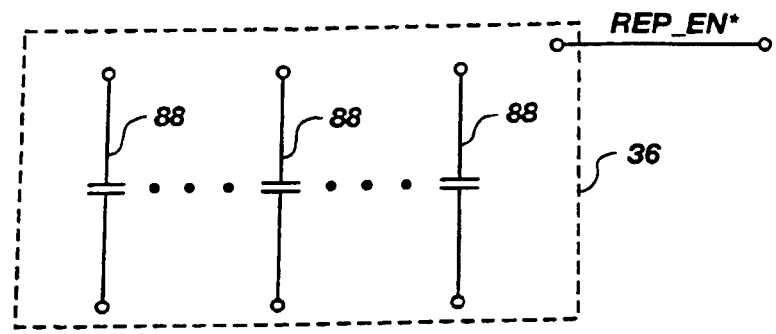
Figure 3C:
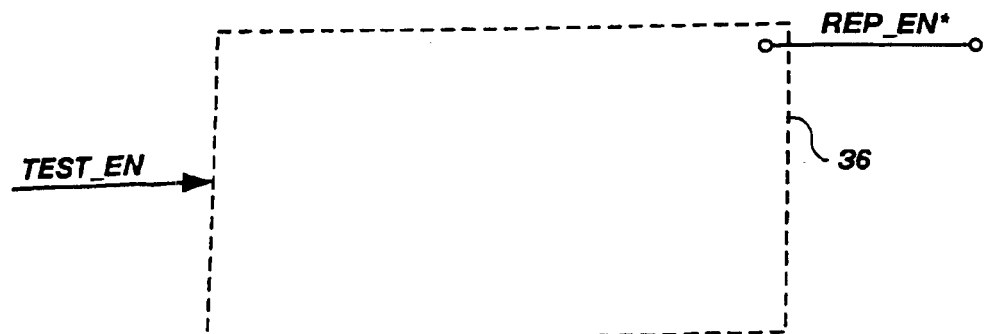

As shown in FIG. 3A, the repair enable circuit 36 includes a plurality of fuses 86 that are configurable to cause the repair enable circuit 36 to output the low, active repair enable signal REP_EN*. The fuses 86 may be configured in a well-known manner by laser or electric current. As shown in FIG. 3B, the repair enable circuit 36 includes a plurality of anti-fuses 88 that are also configurable to cause the repair enable circuit 36 to output the low, active repair enable signal REP_EN*. The anti-fuses 88 may be configured in a well-known manner with a programming voltage. As shown in FIG. 3C, the repair enable circuit 36 is configurable in response to a test mode enable signal TEST_EN from external circuitry (not shown) to cause the repair enable circuit 36 to output the low, active repair enable signal REP_EN*. Such a configuration is desirable so repair of an array in accordance with the present invention may be tested in a temporary manner before it is implemented in a permanent manner using fuses, anti-fuses, or the like.

Figure 4:
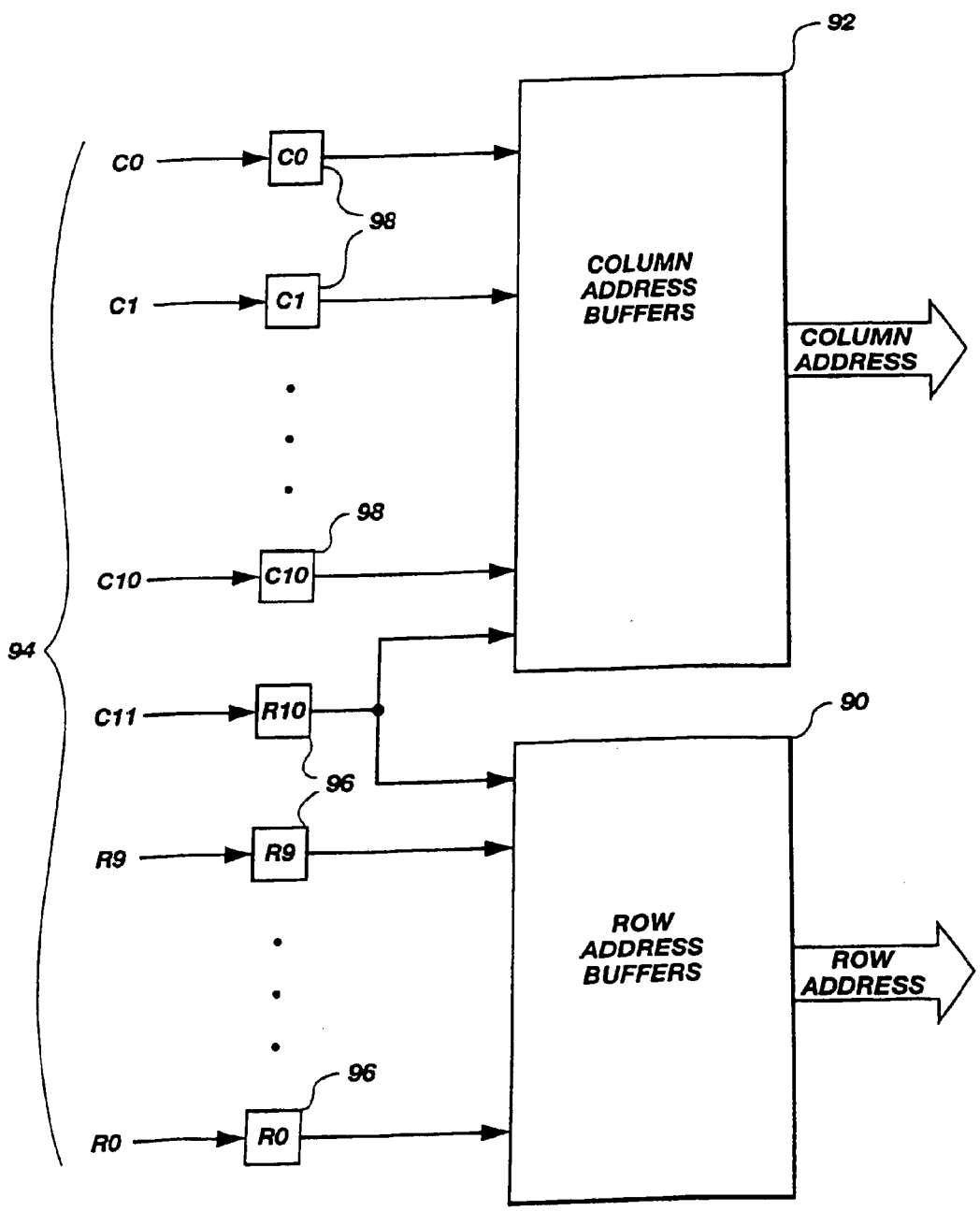
FIG. 4 is a block diagram of a modified version of the memory system of FIG. 2.

A modified version of the memory system 30 of FIG. 2 is shown in FIG. 4. In this modified version, row and column address buffers 90 and 92, respectively, receive a non-multiplexed memory address 94 in the repaired 4-Megabit X1 state of the memory system 30. The memory address 94 includes row address bits R0, . . . , and R9 provided through row address bit die bond pads 96 and column address bits C0, C1, . . . , C11 provided through column address bit die bond pads 98 and one of the row address bit die bond pads 96. As a result, the column address buffers 92 receive the twelve address bits necessary to uniquely address the $2^{12}$ pairs of digit lines in the memory system 30, and the row address buffers 90 receive the ten address bits necessary to uniquely address the $2^{10}$ groups of four word lines in the memory system 30. At the same time, the memory system 30 is recovered from its unrepaired 16-Megabit X1 configuration in a repaired 4-Megabit X1 configuration that is pin compatible with the eleven standard pins in 4-Megabit die packages. Of course, it will be understood that the unrepaired, 16-Megabit X1 configuration and repaired 4-Megabit X1 configuration for the memory system 30 described above are only examples, and that the present invention is therefore not so limited.

Figure 5:
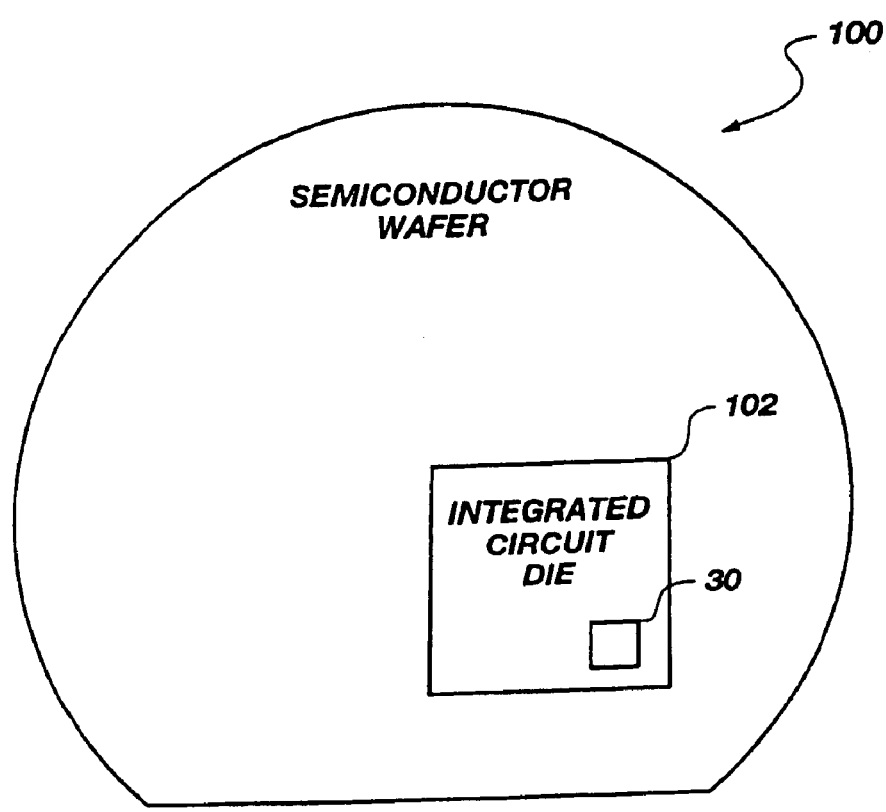
FIG. 5 is a diagram of a semiconductor wafer including an integrated circuit die incorporating the memory system of FIG. 2.

As shown in FIG. 5, a semiconductor wafer 100 includes a yet-to-be cut integrated circuit die 102 that incorporates the memory system 30 of FIG. 2.

Figure 6:
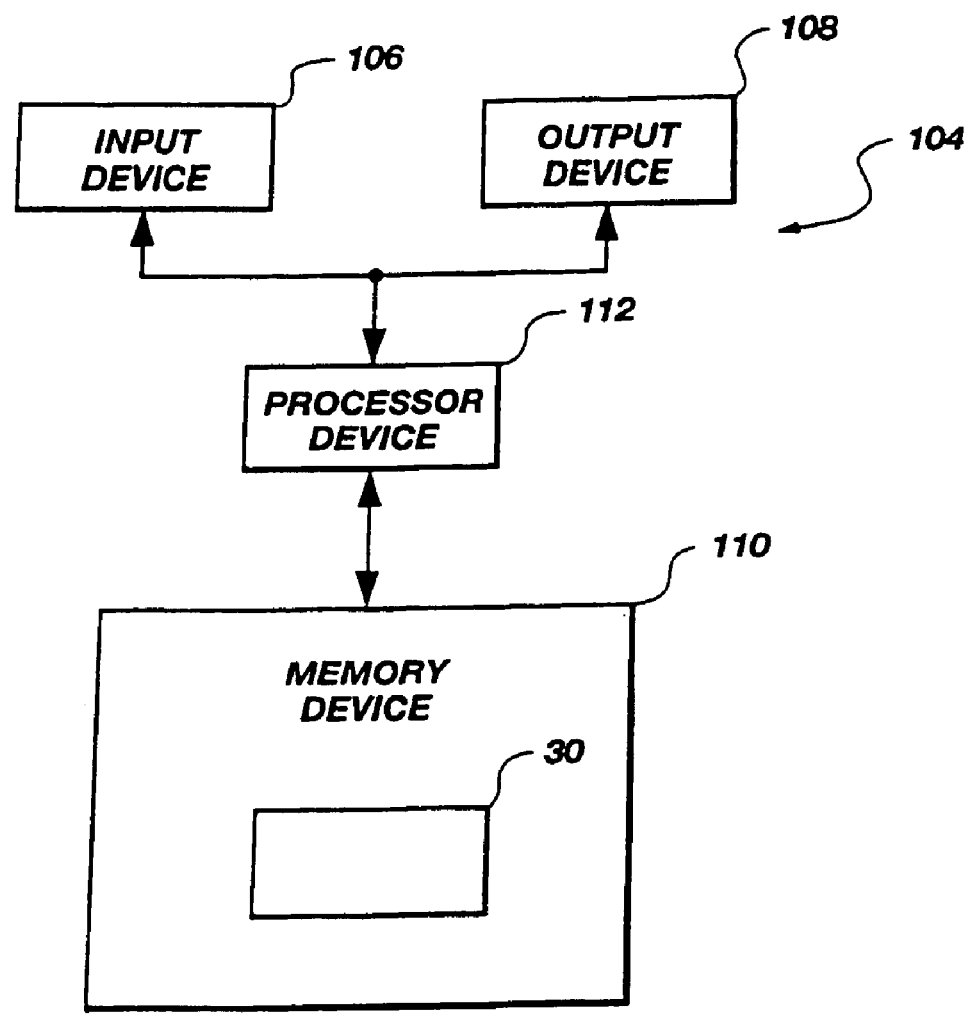
FIG. 6 is a block diagram of an electronic system including a memory device incorporating the memory system of FIG. 2.

As shown in FIG. 6, an electronic system 104 includes an input device 106, an output device 108, and a memory device 110, all coupled to a processor device 112. The memory device 110 incorporates the memory system 30 of FIG. 2.

The present invention thus provides an improved device and method for repairing DRAM and other memory arrays. By grouping two or more word lines together for each memory address, the present invention when applied to a DRAM array effectively halves the time it takes to refresh the array. The present invention also reduces the time $T_{RAC}$ in a DRAM array from the activation of RAS* to the outputting of valid data because the greater charge applied by the present invention to the array's digit lines for each "1" or "0" bit retrieved from the array allows the sense amplifiers in the array to more quickly detect a bit being retrieved. Further, the greater charge applied by the present invention to a DRAM array's digit lines for each "1" or "0" bit retrieved from the array makes the retrieval of bits from the array less sensitive to fluctuations in the supply voltage $V_{CC}$ and the reference voltage $V_{SS}$.

Although the present invention has been described with reference to a particular embodiment, the invention is not limited to this described embodiment. For example, it should be understood that while the described embodiment has been described with respect to memory cells activated in accordance with row addresses and accessed in accordance with column addresses, the present invention is equally applicable to memory systems in which the memory cells are activated in accordance with column addresses and accessed in accordance with row addresses. Therefore, the invention is limited only by the appended claims, which include within their scope all equivalent devices or methods which operate according to the principles of the invention as described.

What is claimed is:

1. A semiconductor device having a memory system having a memory array having more than one word line and having more than one memory cell, the memory system including:

an enabling device for the memory system, the enabling device including at least one programmable element responsive to a first signal for the enabling device to output a second enable signal for energizing more than one word line in said memory array so more than one memory cell of said memory array is accessed;

the memory array comprising:
  a plurality of pairs of complementary digit lines;
  a plurality of word lines;
  a plurality of memory cells, each memory cell of the plurality of memory cells having a control terminal connected to one word line of the plurality of word lines and an access terminal connected to one digit line of a pair of complementary digit lines of the plurality of pairs of complementary digit lines, at least two memory cells of the plurality of memory cells connected to each digit line of a complementary pair of digit lines of the plurality of pairs of complementary digit lines, each memory cell of the plurality of memory cells having a row address;

refresh counter circuitry and address buffer circuitry for generating at least one row address for at least one memory cell of the plurality of memory cells, the refresh counter circuitry comprising CAS-Before-RAS refresh counter circuitry;

row decoder circuitry connected to the plurality of word lines and the address buffer circuitry for energizing at least two word lines of the plurality of word lines in the memory array in accordance with the at least one row address generated by the refresh counter circuitry and the address buffer circuitry;

sense amplifier circuitry connected to the plurality of pairs of complementary digit lines for accessing and refreshing memory cells of the plurality of memory cells coupled to each of the energized at least two word lines of the plurality of word lines; and energizing circuitry connected to the enabling device for energizing more than one word line of the plurality of word lines in the memory array for the at least one row address generated by the refresh counter circuitry and the address buffer circuitry for a memory cell of the plurality of memory cells in response to the enabling device used with the memory system having the memory array so that more than at least one memory cell of the plurality of memory cells are accessible through the plurality of pairs of complementary digit lines for accessing the at least one row address generated by the refresh counter circuitry and the address buffer circuitry.

2. A semiconductor device having a memory system having a plurality of memory arrays including:

each memory array of the plurality of memory arrays comprising:
  at least two pairs of complementary digit lines;
  at least two alternating even and odd word lines;
  a plurality of memory cells, each memory cell of the plurality of memory cells having a control terminal coupled to one of the at least two alternating even and odd word lines and an access terminal coupled to one of the at least two pairs of complementary digit lines;

address buffers for receiving memory addresses and outputting corresponding row and column addresses;

row decoder circuitry coupled to the plurality of memory arrays and the address buffers for energizing at least two word lines in the plurality of memory arrays in accordance with each corresponding row address, the row decoder circuitry comprising:

refresh enable circuitry configurable to output an even row decoder enabling signal and an odd row decoder enabling signal;

an even row decoder coupled to the refresh enable circuitry, the plurality of memory arrays, and the address buffers, and enabled in response to the even row decoder enabling signal to energize one or more even word lines in the plurality of memory arrays in accordance with each corresponding row address; and an odd row decoder coupled to the refresh enable circuitry, the plurality of memory arrays, and the address buffers and enabled in response to the odd row decoder enabling signal to energize one or more odd word lines in the plurality of memory arrays in accordance with each corresponding row address;

a column decoder coupled to the address buffers for outputting corresponding row and column addresses;

sense amplifier and input/output gating circuitry coupled to the column decoder and the plurality of memory arrays for selecting a pair of the at least two pairs of complementary digit line in the plurality of memory arrays in accordance with each column select signal in order to access two or more memory cells in the plurality of memory arrays, each coupled to one of the selected pair of digit lines of the at least two pairs of complementary digit lines and one of at least two energized word lines; and a data buffer coupled to the sense amplifier and input/output gating circuitry for communication between the accessed two or more memory cells and external circuitry.

3. A semiconductor device having apparatus for a dynamic memory array including a pair of complementary digit lines through which a plurality of memory cells activated by a plurality of word lines selected in accordance with row addresses for the plurality of memory cells may be accessed, the semiconductor device comprising:

an enabling device enabling use of the apparatus with the dynamic memory array, the enabling device including at least two programmable elements, the enabling device for responding to a test mode enable signal to temporarily enable charging of the dynamic memory array; and energizing circuitry coupled to the enabling device for energizing more than one of the plurality of word lines in the dynamic memory array in accordance with each row address for a memory cell of the plurality of memory cells in response to the enabling device enabling use of the apparatus with the dynamic memory array so two memory cells of the plurality of memory cells are accessible through the pair of complementary digit lines may be accessed for each row address.

4. In a semiconductor die having a memory array, an apparatus for refreshing the memory array including a pair of complementary digit lines through which a plurality of memory cells activated by a plurality of word lines selected in accordance with row addresses may be accessed, the apparatus for refreshing comprising:

enabling circuitry for effecting refreshing of the memory array; and word line energizing circuitry coupled to the enabling circuitry for energizing a pair of the plurality of word lines in the memory array in accordance with each row address in response to the enabling circuitry effecting refreshing of the memory array so a pair of the plurality of memory cells are accessible through the pair of complementary digit lines for accessing each row address.

5. An apparatus for a memory array including a pair of complementary digit lines through which a plurality of memory cells activated by a plurality of word lines selected in accordance with row addresses may be accessed, the apparatus comprising:

enabling circuitry for enabling the plurality of memory cells to store a charge representing a single stored bit and for directing each memory cell in a group of the plurality of memory cells to share its stored charge with one of two conductors when the single stored bit is to be accessed of the memory array; and word line energizing circuitry coupled to the enabling circuitry for energizing more than one word line of the plurality of word lines in the memory array in accordance with each row address in response to the enabling circuitry enabling the plurality of memory cells to store a charge representing a single stored bit and for directing each memory cell in the group of the plurality of memory cells to share its stored charge with one of two conductors when the single stored bit is to be accessed of the memory array so more than one of the memory cells of the plurality of memory cells are accessible through the pair of complementary digit lines for accessing each row address.

6. The apparatus of claim 5, wherein the plurality of word lines in the memory array comprises a plurality of alternating even and odd word lines, wherein the enabling circuitry is configurable to output an even row decoder enabling signal and an odd row decoder enabling signal, wherein the word line energizing circuitry comprises:

an even row decoder enableable in response to the even row decoder enabling signal to energize one or more even word lines in the plurality of alternating even and odd word lines in the memory array in accordance with each row address; and an odd row decoder enableable in response to the odd row decoder enabling signal to energize one or more odd word lines in the plurality of alternating even and odd word lines in the memory array in accordance with each row address.

7. The apparatus of claim 5, wherein the enabling circuitry comprises a plurality of programmable elements selected from a group comprising a fuse and an anti-fuse.

8. The apparatus of claim 5, wherein the enabling circuitry is configurable in response to a test mode enable signal to enable the plurality of memory cells to store a charge representing a single stored bit and for directing each memory cell in the group of the plurality of memory cells to share its stored charge with one of two conductors when the single stored bit is to be accessed.

9. The apparatus of claim 5, wherein the plurality of memory cells in the memory array includes a plurality of redundant memory cells, wherein the plurality of word lines in the memory array includes a plurality of redundant word lines, wherein the word line energizing circuitry is adapted to energize more than one of the redundant word lines in accordance with selected row addresses when the enabling circuitry enables the plurality of memory cells to store a charge representing a single stored bit and for directing each memory cell in the group of the plurality of memory cells to share its stored charge with one of two conductors when the single stored bit is to be accessed of the memory array so more than one of the plurality of redundant memory cells may be accessed through the pair of complementary digit lines for each of the selected row addresses.

10. The apparatus of claim 5, wherein the word line energizing circuitry is constructed to energize at least two of the plurality of word lines in the memory array in accordance with a first row address and to energize at least four of the word lines in the memory array in accordance with a second row address.

11. The apparatus of claim 5, wherein the word line energizing circuitry is constructed to energize more than one of the word lines in the plurality of word lines in the memory array in accordance with each row address in response to the enabling circuitry enabling the plurality of memory cells to store a charge representing a single stored bit and for directing each memory cell in the group of the plurality of memory cells to share its stored charge with one of two conductors when the single stored bit is to be accessed of the memory array so more than one of the memory cells of the plurality of memory cells are accessible through the pair of complementary digit lines for refreshing each row address.

12. A memory system for a semiconductor device comprising:
   a memory array comprising:
      a plurality of pairs of complementary digit lines;
      a plurality of word lines selectable in accordance with row addresses; and
      a plurality of memory cells each having a control terminal coupled to one word line of the plurality of word lines and an access terminal coupled to one digit line of the plurality of pairs of complementary digit lines;
   enabling circuitry for enabling repair of the memory array; and
   word line energizing circuitry coupled to the memory array and the enabling circuitry for energizing more than one word line of the plurality of word lines in the memory array in accordance with each row address in response to the enabling circuitry enabling the plurality of memory cells to store a charge representing a single stored bit and for directing each memory cell in a group of the plurality of memory cells to share its stored charge with one of two conductors when the single stored bit is to be accessed of the memory array so two or more of the memory cells of the plurality of memory cells are accessible through each pair of complementary digit lines for each row address.

13. The memory system of claim 12, wherein the plurality of word lines in the memory array comprises a plurality of alternating even and odd word lines, wherein the enabling circuitry is configurable to output an even row decoder enabling signal and an odd row decoder enabling signal, wherein the word line energizing circuitry comprises:
   an even row decoder enableable in response to the even row decoder enabling signal to energize one or more even word lines of the plurality of alternating even and odd word lines in the memory array in accordance with each row address; and
   an odd row decoder enableable in response to the odd row decoder enabling signal to energize one or more odd word lines of the plurality of alternating even and odd word lines in the memory array in accordance with each row address.

14. The memory system of claim 12, wherein the enabling circuitry is configurable in response to a test mode enable signal to enable the plurality of memory cells to store a charge representing a single stored bit and for directing each memory cell in the group of the plurality of memory cells to share its stored charge with one of two conductors when the single stored bit is to be accessed.

15. The memory system of claim 12, wherein the plurality of memory cells in the memory array includes a plurality of redundant memory cells, wherein the plurality of word lines in the memory array includes a plurality of redundant word lines, wherein the word line energizing circuitry is adapted to energize more than one of the redundant word lines of the plurality of redundant word lines in accordance with selected row addresses when the enabling circuitry enables the plurality of memory cells to store a charge representing a single stored bit and for directing each memory cell in the group of the plurality of memory cells to share its stored charge with one of two conductors when the single stored bit is to be accessed of the memory array so two or more of the plurality of redundant memory cells are accessible through each pair of complementary digit lines of the plurality of complementary digit lines for each of the selected row addresses.

16. An integrated circuit semiconductor die comprising:
   a memory array comprising:
      a plurality of pairs of complementary digit lines;
      a plurality of word lines selectable in accordance with row addresses; and
      a plurality of memory cells each having a control terminal coupled to one of the plurality of word lines and an access terminal coupled to one of the plurality of pairs of complementary digit lines;
   enabling circuitry for enabling repair of the memory array; and
   word line energizing circuitry coupled to the memory array and the enabling circuitry for energizing more than one of the plurality of word lines in the memory array in accordance with each row address in response to the enabling circuitry enabling the plurality of memory cells to store a charge representing a single stored bit and for directing each memory cell in a group of the plurality of memory cells to share its stored charge with one of two conductors when the single stored bit is to be accessed of the memory array so two or more of the memory cells are accessible through each pair of complementary digit lines of the plurality of pairs of complementary digit lines for each row address.

17. A semiconductor wafer including an integrated circuit as part of a semiconductor device comprising:
   a memory array comprising:
      a plurality of pairs of complementary digit lines;
      a plurality of word lines selectable in accordance with row addresses; and
      a plurality of memory cells each having a control terminal coupled to one of the plurality of word lines and an access terminal coupled to one of the plurality of pairs of complementary digit lines;
   enabling circuitry for enabling repair of the memory array; and
   word line energizing circuitry coupled to the memory array and the enabling circuitry for energizing more than one of the plurality of word lines in the memory array in accordance with each row address in response to the enabling circuitry enabling the plurality of memory cells to store a charge representing a single stored bit and for directing each memory cell in a group of the plurality of memory cells to share its stored charge with one of two conductors when the single stored bit is to be accessed of the memory array so two or more of the plurality of memory cells are accessible through each pair of complementary digit lines of the plurality of pairs of complementary digit lines for each row address.

18. An electronic system including an input device, an output device, and a memory device, and a processor device coupled to the input device, the output device, and the memory device, the memory device comprising:
   a memory array comprising:
      a plurality of pairs of complementary digit lines;
      a plurality of word lines selectable in accordance with row addresses; and a plurality of memory cells each having a control terminal coupled to one of the plurality of word lines and an access terminal coupled to one of the plurality of pairs of complementary digit lines;

enabling circuitry for enabling repair of the memory array; and word line energizing circuitry coupled to the memory array and the enabling circuitry for energizing more than one of the plurality of word lines in the memory array in accordance with each row address in response to the enabling circuitry enabling the plurality of memory cells to store a charge representing a single stored bit and for directing each memory cell in a group of the plurality of memory cells to share its stored charge with one of two conductors when the single stored bit is to be accessed of the memory array so two or more of the plurality of memory cells are accessible through each pair of complementary digit lines of the plurality of pairs of complementary digit lines for each row address.

19. In a memory array in a semiconductor device in which stored bits are accessed by detecting a change in voltage between two conductors caused by sharing a charge stored in one of a plurality of memory cells in the memory array with one of the two conductors, an apparatus for the plurality of memory cells to store a charge representing a single stored bit and for directing each memory cell in a group of the plurality of memory cells to share its stored charge with one of the two conductors when the single stored bit is to be accessed in the memory array when some of the plurality of memory cells in the memory array cannot retain a sufficient charge to cause a detectable change in the voltage on one of the two conductors, the apparatus comprising circuitry for directing each memory cell in the group of the plurality of memory cells to store a charge representing a single stored bit and for directing each memory cell in the group of the plurality of memory cells to share its stored charge with one of the two conductors when the single stored bit is to be accessed.

20. The apparatus of claim 19, wherein the circuitry comprises row decoder circuitry.

21. A memory system in a semiconductor device comprising:

a memory array comprising:
   a plurality of pairs of complementary digit lines;
   a plurality of alternating even and odd word lines;
   a plurality of memory cells each having a control terminal coupled to one of the word lines of the plurality of alternating even and odd word lines and an access terminal coupled to one of the plurality of pairs of complementary digit lines;

address buffers for receiving memory addresses and outputting corresponding row and column addresses;

row decoder circuitry coupled to the memory array and the address buffers for energizing at least two word lines of the plurality of alternating even and odd word lines in the memory array in accordance with each row address;

a column decoder coupled to the address buffers for outputting a column select signal in accordance with each column address;

sense amplifier and input/output gating circuitry coupled to the column decoder and the memory array for selecting a pair of complementary digit lines of the plurality of pairs of complementary digit lines in the memory array in accordance with each column select signal in order to access two or more of the plurality of memory cells in the memory array each coupled to one of the selected pair of digit lines and one of the at least two energized word lines; and a data buffer coupled to the sense amplifier and input/output gating circuitry for communication between the accessed two or more memory cells and external circuitry.

22. The memory system of claim 21, wherein the memory array comprises a dynamic random access memory (DRAM) array.

23. The memory system of claim 21, wherein each memory cell of the plurality of memory cells comprises a MOS transistor and a capacitor.

24. The memory system of claim 21, wherein the row decoder circuitry comprises:

enable circuitry configurable to output an even row decoder enabling signal and an odd row decoder enabling signal;

an even row decoder coupled to repair enable circuitry, the memory array, and the address buffers and enableable in response to the even row decoder enabling signal to energize one or more even word lines of the plurality of alternating even and odd word lines in the memory array in accordance with each row address; and an odd row decoder coupled to the enable circuitry, the memory array, and the address buffers and enableable in response to the odd row decoder enabling signal to energize one or more odd word lines of the plurality of alternating even and odd word lines in the memory array in accordance with each row address.

25. The memory system of claim 21, wherein the row decoder circuitry is configurable in response to a test mode enable signal to energize one or more even word lines and one or more odd word lines of the plurality of alternating even and odd word lines in accordance with each row address.

26. The memory system of claim 21, wherein the data buffer includes DC sense amplifiers, write drivers, an output buffer, and an input buffer.

27. The memory system of claim 21, wherein the plurality of alternating even and odd word lines includes a plurality of alternating even and odd redundant word lines, wherein the plurality of memory cells includes a plurality of redundant memory cells each having a control terminal coupled to one of the plurality of alternating even and odd redundant word lines and an access terminal coupled to one of the plurality of pairs of complementary digit lines, wherein the row decoder circuitry is capable of energizing one or more even redundant word lines in the memory array and one or more odd redundant word lines in the memory array in accordance with selected row addresses, wherein the sense amplifier and input/output gating circuitry is capable of selecting a pair of complementary digit lines of the plurality of pairs of complementary digit lines in the memory array in accordance with a column select signal in order to access two or more of the plurality of redundant memory cells in the memory array each coupled to one of the selected pair of complementary digit lines and an energized redundant word line.

28. The memory system of claim 21, wherein each memory cell of the plurality of memory cells coupled to an even word line energized by the row decoder circuitry in accordance with each row address is coupled to the same digit line of the plurality of pairs of complementary digit lines as a memory cell of the plurality coupled to an odd word line energized by the row decoder circuitry in accordance with the row address.

29. The memory system of claim 28, wherein the access terminal of each of the plurality of memory cells is coupled to one of the plurality of pairs of complementary digit lines via a digit line contact, wherein each memory cell of the plurality coupled to an even word line energized by the row decoder circuitry in accordance with each row address shares a digit line contact with a memory cell of the plurality coupled to an odd word line energized by the row decoder circuitry in accordance with the row address.

30. The memory system of claim 21, wherein each memory cell of the plurality coupled to even word lines energized by the row decoder circuitry in accordance with each row address is coupled to a different digit line of the plurality of pairs of complementary digit lines than any memory cells of the plurality coupled to any odd word lines energized by the row decoder circuitry in accordance with the row address.

31. A memory system in a semiconductor device comprising:
   a memory array comprising:
      a plurality of pairs of complementary digit lines;
      a plurality of word lines;
      a plurality of memory cells each having a control terminal coupled to one of the plurality of word lines and an access terminal coupled to one of the plurality of pairs of complementary digit lines;
   address buffers for receiving multiplexed memory addresses in the form of a first plurality of address bits followed in time by a second plurality of address bits, for outputting a row address and a first portion of a column address for each multiplexed memory address corresponding to the first plurality of address bits associated with the multiplexed memory addresses, and for outputting a second portion of the column address for each multiplexed memory address corresponding to the second plurality of address bits associated with the multiplexed memory addresses;
   row decoder circuitry coupled to the memory array and the address buffers for energizing at least two of the plurality of word lines in the memory array in accordance with each row address;
   a column decoder coupled to the address buffers for outputting a column select signal in accordance with the first and second portions of each column address;
   sense amplifier and input/output gating circuitry coupled to the column decoder and the memory array for selecting a pair of complementary digit lines of the plurality of pairs of complementary digit lines in the memory array in accordance with each column select signal in order to access at least two of the plurality of memory cells in the memory array each coupled to the selected pair of complementary digit lines and one of the at least two energized word lines; and
   a data buffer coupled to the sense amplifier and input/output gating circuitry for communication between the accessed at least two memory cells and external circuitry.

32. The memory system of claim 31, wherein the address buffers comprise;
   a row address buffer for receiving the multiplexed memory addresses, latching in one or more bits from each first plurality of address bits, and outputting each corresponding row address; and
   a column address buffer for receiving the multiplexed memory addresses, latching in one or more bits from each first plurality of address bits, outputting the corresponding first portion of each column address, latching in the second plurality of address bits, and outputting the corresponding second portion of each column address.

33. A memory system in a semiconductor device comprising:
   a memory array comprising:
      a plurality of pairs of complementary digit lines;
      a plurality of word lines;
      a plurality of memory cells each having a control terminal coupled to one of the plurality of word lines and an access terminal coupled to one of the plurality of pairs of complementary digit lines;
   a plurality of row address bit terminals for receiving a first plurality of address bits associated with a non-multiplexed memory address;
   a plurality of column address bit terminals for receiving a second plurality of address bits associated with the non-multiplexed memory address;
   address buffers coupled to the row and column address bit terminals for outputting a row address corresponding to a first portion of the first plurality of address bits and for outputting a column address corresponding to both the second plurality of address bits and a second portion of the first plurality of address bits;
   row decoder circuitry coupled to the memory array and the address buffers for energizing at least two of the plurality of word lines in the memory array in accordance with the row address;
   a column decoder coupled to the address buffers for outputting a column select signal in accordance with the column address;
   sense amplifier and input/output gating circuitry coupled to the column decoder and the memory array for selecting a pair of complementary digit lines of the plurality of pairs of complementary digit lines in the memory array in accordance with the column select signal in order to access at least two of the plurality of memory cells in the memory array each coupled to the selected pair of complementary digit lines and one of the at least two energized word lines; and
   a data buffer coupled to the sense amplifier and input/output gating circuitry for communication between the accessed at least two memory cells and external circuitry.

34. The memory system of claim 33, wherein the plurality of row and column address bit terminals comprise integrated circuit die bond pads.

35. In a memory array in a semiconductor device in which stored bits are accessed by using sense amplifiers to detect a change in voltage between two conductors caused by sharing a charge stored in one of a plurality of memory cells in the memory array with one of the two conductors, an apparatus for repairing the memory array when some of the sense amplifiers in the memory array cannot detect a change in the voltage on one of the two conductors caused by sharing a charge stored in one of the plurality of memory cells with one of the two conductors, the apparatus comprising circuitry for directing each memory cell in a group of the plurality of memory cells to store a charge representing a single stored bit and for directing each memory cell in the group of the plurality of memory cells to share its stored charge with one of the two conductors when the single stored bit is to be accessed.

36. In a semiconductor device having an apparatus for a plurality of memory cells to store a charge representing a single stored bit in a memory array including a pair of complementary digit lines through which the plurality of memory cells activated by a plurality of word lines selected in accordance with row addresses may be accessed, the apparatus comprising:

enabling circuitry for enabling access to a single stored bit of the memory array; and word line energizing circuitry coupled to the enabling circuitry for energizing an adjacent pair of the plurality of word lines in the memory array in accordance with each row address in response to the enabling circuitry enabling the plurality of memory cells to store a charge representing a single stored bit and for directing each memory cell in a group of the plurality of memory cells to share its stored charge with one of two conductors when the single stored bit is to be accessed of the memory array so an adjacent pair of the plurality of memory cells are accessible through the pair of complementary digit lines for accessing each row address.

37. An apparatus for repairing a memory array including a plurality of pairs of complementary digit lines through which a plurality of memory cells activated by a plurality of word lines selected in accordance with row addresses may be accessed, the apparatus comprising:

enabling circuitry for enabling access of a single stored bit of the memory array; and word line energizing circuitry coupled to the enabling circuitry for energizing at least two of the plurality of word lines in the memory array in accordance with a first row address in response to the enabling circuitry enabling repair of the memory array so at least two of the plurality of memory cells are accessible through one of the plurality of pairs of complementary digit lines may be accessed for the first row address and for energizing at least four of the plurality of word lines in the memory array in accordance with a second row address in response to the enabling circuitry enabling the plurality of memory cells to store a charge representing a single stored bit and for directing each memory cell in a group of the plurality of memory cells to share its stored charge with one of two conductors when the single stored bit is to be accessed of the memory array so at least four of the plurality of memory cells are accessible through one of the plurality of pairs of complementary digit lines for accessing the second row address.

38. In a semiconductor device having a refreshable dynamic memory system comprising:

a memory array comprising:

a plurality of pairs of complementary digit lines;

a plurality of word lines;

a plurality of memory cells each having a control terminal coupled to one of the plurality of word lines and an access terminal coupled to one of the plurality of pairs of complementary digit lines, the plurality of memory cells to store a charge representing a single stored bit and for directing each memory cell in a group of the plurality of memory cells to share its stored charge with one of two conductors when the single stored bit is to be accessed;

refresh counter and address buffer circuitry for generating row addresses;

row decoder circuitry coupled to the plurality of word lines and the address buffer circuitry for energizing at least two of the plurality of word lines in the memory array in accordance with each generated row address; and sense amplifier circuitry coupled to the plurality of pairs of complementary digit lines for accessing and refreshing one of the plurality of pairs of complementary digit lines coupled to each of the energized at least two word lines.

39. The memory system of claim 38, wherein the refresh counter comprises CAS-before-RAS refresh counter circuitry.

40. A method for a memory array of a semiconductor device of a type to store a bit by storing a charge in at least two memory cells, the memory array also being of a type to access the bit by sharing the stored charge with one of two conductors and then detecting a resulting change in voltage between the two conductors, the memory array needing to store the bit in at least two memory cells as the result of having at least one memory cell that is unable to retain a sufficient charge to cause a detectable change in the voltage on one of the two conductors, the method comprising:

directing the at least two memory cells in a group of memory cells in the memory array to each store the same bit by each storing a charge representing the bit; and directing each memory cell in the group of memory cells to share its stored charge with one of the two conductors when the stored bit is to be accessed.

41. The method of claim 40, wherein directing the at least two memory cells in the group of memory cells to each store the same bit by each storing a charge representing the bit comprises energizing a word line coupled to each memory cell in the group.

42. The method of claim 40, wherein directing each memory cell in the group of memory cells to share its stored charge with one of the two conductors comprises energizing a word line coupled to each memory cell in the group.

43. A method for storing a bit in a memory array having a plurality of memory cells, each of the plurality of memory cells coupled to one of a pair of complementary digit lines in a semiconductor device, the method comprising:

providing a charge representing the bit on each of the one of a pair of complementary digit lines;

storing the charge provided on the one of a pair of complementary digit lines in one of the plurality of memory cells; and storing the charge provided on the one of a pair of complementary digit lines in another of the plurality of memory cells to store a charge representing a single stored bit and for directing each memory cell in the plurality of memory cells to share its stored charge with one of two conductors when the single stored bit is to be accessed.

44. A method of testing a memory array of a semiconductor device of a type to store a bit by storing a charge in a memory cell, the memory array also being of a type to access the bit by sharing the stored charge with one of two conductors and then detecting a resulting change in voltage between the two conductors, the method comprising:

directing the memory cell in a group of memory cells in the memory array to each store the same bit by each storing a charge representing the bit;

directing each memory cell in the group of memory cells to share its stored charge with one of the two conductors; and attempting to detect a change in the voltage between the two conductors resulting from each memory cell in the group of memory cells sharing their stored charges with the two conductors.

45. A method for a memory array of a semiconductor device of a type to store a bit by storing a charge in at least two memory cells, the memory array accessing the bit by sharing the stored charge with one of two conductors and then detecting a resulting change in voltage between the two conductors, the memory array storing the bit in the at least two memory cells of the memory array as the result of having at least one memory cell retaining inadequate charge to cause a detectable change in voltage on one of the two conductors, the method comprising:

causing the at least two memory cells in a group of memory cells in the memory array to each store the same bit by each storing a charge representing the bit; and causing each of the at least two memory cells in the group of memory cells to share its stored charge with one of the two conductors when the stored bit is to be accessed.

46. The method of claim 45, wherein causing the at least two memory cells in the group of memory cells to each store the same bit by each storing a charge representing the bit comprises energizing a word line coupled to the at least two memory cells in the group.

47. The method of claim 45, wherein causing each of the at least two memory cells in the group of memory cells to share its stored charge with one of the two conductors comprises energizing a word line coupled to each memory cell in the group.

48. A method for storing a bit in a memory array having a plurality of memory cells each coupled to one of a pair of complementary digit lines in a semiconductor device, the method comprising:

sending a charge representing the bit on each of the one of a pair of complementary digit lines;

storing the charge provided on the one of a pair of complementary digit lines in one of the plurality of memory cells; and storing the charge provided on the one of a pair of complementary digit lines in another of the plurality of memory cells to store a charge representing a single stored bit and for directing each memory cell in the plurality of memory cells to share its stored charge with one of two conductors when the single stored bit is to be accessed.

49. A method of testing a memory array of a semiconductor device of a type to store a bit by storing a charge in a memory cell, the memory array also being of a type to access the bit by sharing the stored charge with one of two conductors and then detecting a resulting change in voltage between the two conductors, the method comprising:

directing the memory cell in a group of at least two memory cells in the memory array to each store the same bit by each storing a charge representing the bit;

causing each memory cell in the group of at least two memory cells to share its stored charge with one of the two conductors; and attempting to detect a change in the voltage between the two conductors resulting from the group of at least two memory cells sharing their stored charges with the two conductors.

50. A method for a memory array of a semiconductor device that stores a bit by storing a charge in at least two memory cells, the memory array accessing the bit by sharing the stored charge with one of two conductors and detecting a resulting change in voltage between the two conductors, the memory array storing the bit in the at least two memory cells of the memory array as the result of having at least one memory cell that does not retain a sufficient charge to cause a detectable change in the voltage on one of the two conductors, the method comprising:

causing the at least two memory cells in a group of memory cells in the memory array to each store the same bit by each storing a charge representing the bit; and causing each of the at least two memory cells in the group of memory cells to share its stored charge with one of the two conductors when the stored bit is to be accessed.

51. The method of claim 50, wherein causing the at least two memory cells in the group of memory cells to each store the same bit by each storing a charge representing the bit comprises energizing a word line coupled to each of the at least two memory cells in the group of memory cells.

52. The method of claim 50, wherein causing each of the at least two memory cells in the group of memory cells to share its stored charge with one of the two conductors comprises energizing a word line coupled to each of the at least two memory cells in the group of memory cells.

53. A method for storing a bit in a memory array having at least two memory cells each coupled to one of a pair of complementary digit lines in a semiconductor device, the method comprising:

causing a charge representing the bit on each of the one of a pair of complementary digit lines;

storing the charge provided on the one of a pair of complementary digit lines in one of the at least two memory cells; and storing the charge provided on the one of a pair of complementary digit lines in another of the at least two memory cells to store a charge representing a single stored bit and to direct each memory cell in the at least two memory cells to share its stored charge with the one of a pair of complementary digit lines during accessing the single stored bit.

54. A method of evaluating a memory array of a semiconductor device storing a bit by storing a charge in a memory cell, the memory array accessing the bit by sharing the stored charge with one of two conductors and detecting a resulting change in voltage between the two conductors, the method comprising:

causing the memory cell in a group of memory cells in the memory array to each store the same bit by each storing a charge representing the bit;

directing each memory cell in the group of memory cells to share its stored charge with one of the two conductors; and detecting a change in the voltage between the two conductors resulting from the group of memory cells sharing their stored charges with the two conductors.

55. A method of a memory array of a semiconductor device storing a bit by storing a charge in at least two memory cells, the memory array accessing the bit by sharing the stored charge with one of two conductors and detecting a resulting change in voltage between the two conductors, the memory array storing the bit in the at least two memory cells for causing an adequate charge causing a detectable change in the voltage on one of the two conductors, the method comprising:

causing the at least two memory cells in a group of memory cells in the memory array to each store the same bit by each storing a charge representing the bit; and causing each of the at least two memory cells in the group of memory cells to share its stored charge with one of the two conductors when accessing the stored bit.

56. The method of claim 55, wherein causing the at least two memory cells in the group of memory cells to each store the same bit by each storing a charge representing the bit comprises energizing a word line coupled to each of the at least two memory cells in the group of memory cells.

57. The method of claim 55, wherein causing each of the at least two memory cells in the group of memory cells to share its stored charge with one of the two conductors comprises energizing a word line coupled to each of the at least two memory cells in the group of memory cells.

58. A method for storing a bit in a memory array having a plurality of memory cells, each memory cell of the plurality of memory cells coupled to one of a pair of complementary digit lines in a semiconductor device, the method comprising:
   establishing a charge representing the bit on each of the one of a pair of complementary digit lines;
   storing the charge provided on the one of a pair of complementary digit lines in one of the plurality of memory cells; and
   storing the charge provided on the one of a pair of complementary digit lines in another of the plurality of memory cells for storing a charge representing a single stored bit and for directing each memory cell in the plurality of memory cells to share its stored charge with one of two conductors when the single stored bit is to be accessed.

59. A method of operating a memory array of a semiconductor device for storing a bit by storing a charge in a memory cell, the memory array accessing the bit by sharing the stored charge with one of two conductors and detecting a resulting change in voltage between the two conductors, the method comprising:
   directing the memory cell in a group of at least two memory cells in the memory array to each store the same bit by each storing a charge representing the bit;
   causing each memory cell in the group of at least two memory cells to share its stored charge with one of the two conductors; and
   detecting a change in the voltage between the two conductors when the group of at least two memory cells share their stored charges with the two conductors.

60. In a method of a memory array of a semiconductor device storing a bit by storing a charge in at least two memory cells, the memory array accessing the bit by sharing the stored charge with one of two conductors for detecting a resulting change in voltage between the two conductors, the memory array storing the bit in the at least two memory cells for causing a detectable change in the voltage on one of the two conductors, the method comprising:
   storing the same bit by storing a charge representing the bit in the at least two memory cells in a group of memory cells in the memory array; and
   causing each of the at least two memory cells in the group of memory cells to share its stored charge with one of the two conductors by accessing the stored bit.

61. The method of claim 60, wherein causing each of the at least two memory cells in the group of memory cells to share its stored charge with one of the two conductors comprises energizing a word line coupled to each of the at least two memory cells in the group of memory cells.

62. In a method for storing a bit in a memory array having a plurality of memory cells, each memory cell of the plurality of memory cells coupled to one of a pair of complementary digit lines in a semiconductor device, the method comprising:
   causing a charge representing the bit on each of the one of a pair of complementary digit lines;
   storing the charge provided on the one of a pair of complementary digit lines in one of the plurality of memory cells; and
   storing the charge provided on the one of a pair of complementary digit lines in another memory cell of the plurality of memory cells for storing a charge representing a single stored bit for directing each memory cell in the plurality of memory cells to share its stored charge with the one of a pair of complementary digit lines when accessing the single stored bit.

63. In a method of operating a memory array of a semiconductor device storing a bit by storing a charge in a memory cell, the memory array accessing the bit by sharing the stored charge with one of two conductors for detecting a resulting change in voltage between the two conductors, the method comprising:
   storing a charge representing the bit in the memory cell in a group of at least two memory cells in the memory array;
   causing each memory cell in the group of at least two memory cells to share its stored charge with one of the two conductors; and
   detecting a change in the voltage between the two conductors from the each memory cell in the group of at least two memory cells sharing their stored charges with the two conductors.

64. In a method of the operation of a semiconductor device having a memory array storing a bit by storing a charge in at least two memory cells, the memory array accessing the bit by sharing the stored charge with one of two conductors and detecting a change in voltage between the two conductors, the memory array storing the bit in the at least two memory cells for causing a detectable change in voltage on one of the two conductors, the method comprising:
   sending a charge representing the bit for the storing thereof in the at least two memory cells in a group of memory cells in the memory array; and
   causing each of the at least two memory cells in the group of memory cells to share its stored charge with one of the two conductors when the stored bit is to be accessed.

65. The method of claim 64, wherein causing each of the at least two memory cells in the group of memory cells to share its stored charge with one of the two conductors comprises energizing a word line coupled to each of the at least two memory cells in the group of memory cells.

66. In a method of operating a semiconductor device for storing a bit in a memory array having a plurality of memory cells, each of the plurality of memory cells coupled to one of a pair of complementary digit lines therein, the method comprising:
   sending a charge representing the bit on each of the one of a pair of complementary digit lines;
   storing the charge provided on the one of a pair of complementary digit lines in one of the plurality of memory cells; and
   storing the charge provided on the one of a pair of complementary digit lines in another memory cell of the plurality of memory cells representing a single stored bit for directing each memory cell in the plurality of memory cells to share its stored charge with one of two conductors when the single stored bit is to be accessed.

67. A method of assessing a semiconductor device having a memory array for storing a charge in a memory cell, the memory array accessing the bit by sharing the stored charge with one of two conductors and detecting a change in voltage between the two conductors, the method comprising:

making the memory cell in a group of at least two memory cells in the memory array to each store the same bit by each memory cell in the group of the at least two memory cells storing a charge representing the bit;

making each memory cell in the group of at least two memory cells to share its stored charge with one of the two conductors; and attempting to establish a change in the voltage between the two conductors from the group of at least two memory cells sharing their stored charges with the two conductors.

68. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting a change in the voltage on one of the two conductors, the method comprising:

causing the at least two memory cells in a group of memory cells in the memory array to each store the same bit by each storing a charge representing the bit by substantially storing one of $V_{CC}$ and $V_{SS}$; and directing each of the at least two memory cells in the group of memory cells to share its stored charge with one of the two conductors for accessing the stored bit as substantially one of $V_{CC}$ and $V_{SS}$.

69. The method of claim 68, wherein causing the at least two memory cells in the group of memory cells to each store the same bit of substantially one of $V_{CC}$ and $V_{SS}$ by each storing a charge representing the bit comprises energizing a word line coupled to each of the at least two memory cells in the group of memory cells.

70. The method of claim 68, wherein directing each of the at least two memory cells in the group of memory cells to share its stored charge of substantially one of $V_{CC}$ and $V_{SS}$ with one of the two conductors comprises energizing a word line coupled to each of the at least two memory cells in the group of memory cells.

71. In a method for a semiconductor device for storing a bit in a memory array having a plurality of memory cells, each of the plurality of memory cells coupled to one of a pair of complementary digit lines in the semiconductor device, the method comprising:

applying a charge representing the bit on each of the one of a pair of complementary digit lines by applying substantially one of $V_{CC}$ and $V_{SS}$;

storing the charge of substantially one of $V_{CC}$ and $V_{SS}$ provided on the one of a pair of complementary digit lines in one of the plurality of memory cells; and storing the charge of substantially one of the $V_{CC}$ and $V_{SS}$ provided on the one of a pair of complementary digit lines in another memory cell of the plurality of memory cells to store a charge representing a single stored bit of substantially one of $V_{CC}$ and $V_{SS}$ and for directing each memory cell in the plurality of memory cells to share its stored charge with the one of a pair of complementary digit lines when the single stored bit of substantially one of $V_{CC}$ and $V_{SS}$ is to be accessed.

72. In a method for operating a semiconductor device having a memory array to store a bit by storing a charge in a memory cell, the memory array also being of a type to access the bit by sharing the stored charge with one of two conductors and detecting a resulting change in voltage between the two conductors, the method comprising:

causing the memory cell in a group of at least two memory cells in the memory array to each store the same bit by each storing a charge representing the bit by storing substantially one of $V_{CC}$ and $V_{SS}$;

causing each memory cell in the group of at least two memory cells to share its stored charge of substantially one of $V_{CC}$ and $V_{SS}$ with one of the two conductors; and attempting to detect a change in the voltage between the two conductors resulting from the group of at least two memory cells sharing their stored charges of substantially one of $V_{CC}$ and $V_{SS}$ with the two conductors.

73. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting a change in the voltage on one of the two conductors, the method comprising:

causing the at least two memory cells in a group of memory cells in the memory array to each store the same bit by each storing a charge representing the bit by storing one of about the supply voltage $V_{CC}$ and about the reference voltage $V_{SS}$; and directing each of the at least two memory cells in the group of memory cells to share its stored charge with one of the two conductors for accessing the stored bit as one of about the supply voltage $V_{CC}$ and about the reference voltage $V_{SS}$.

74. The method of claim 73, wherein causing the at least two memory cells in the group of memory cells to each store the same bit of one of about the supply voltage $V_{CC}$ and about the reference voltage $V_{SS}$ by each storing a charge representing the bit comprises energizing a word line coupled to each of the at least two memory cells in the group of memory cells.

75. The method of claim 73, wherein directing each of the at least two memory cells in the group of memory cells to share its stored charge of one of about the supply voltage $V_{CC}$ and about the reference voltage $V_{SS}$ with one of the two conductors comprises energizing a word line coupled to each of the at least two memory cells in the group of memory cells.

76. In a method for a semiconductor device for storing a bit in a memory array having a plurality of memory cells, each of the plurality of memory cells coupled to one of a pair of complementary digit lines in the semiconductor device, the method comprising:

applying a charge representing the bit on each of the one of a pair of complementary digit lines by applying one of about a supply voltage $V_{CC}$ and about a reference voltage $V_{SS}$;

storing the charge of one of about the supply voltage $V_{CC}$ and about the reference voltage $V_{SS}$ provided on the one of a pair of complementary digit lines in one of the plurality of memory cells; and storing the charge provided on the one of a pair of complementary digit lines in another memory cell of the plurality of memory cells to store a charge representing a single stored bit of one of about the supply voltage $V_{CC}$ and about the reference voltage $V_{SS}$ and for directing each memory cell in the plurality of memory cells to share its stored charge with the one of a pair of complementary digit lines when the single stored bit for accessing one of about the supply voltage $V_{CC}$ and about the reference voltage $V_{SS}$.

77. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting the change in voltage on one of the two conductors, the method comprising:

causing the at least two memory cells in a group of memory cells in the memory array to each store the same bit by each storing a charge representing the bit by storing one of about a supply voltage $V_{CC}$, a positive electric charge, and about a reference voltage $V_{SS}$, a negative electric charge; and directing each of the at least two memory cells in the group of memory cells to share its stored charge with one of the two conductors for accessing the stored bit as one of about the supply voltage $V_{CC}$, a positive electric charge, and about the reference voltage $V_{SS}$, a negative electric charge.

78. The method of claim 77, wherein causing the at least two memory cells in the group of memory cells to each store the same bit of one of about the supply voltage $V_{CC}$, a positive electric charge, and about the reference voltage $V_{SS}$, a negative electric charge, by each storing a charge representing the bit comprises energizing a word line coupled to each of the at least two memory cells in the group of memory cells.

79. The method of claim 77, wherein directing each of the at least two memory cells in the group of memory cells to share its stored charge of one of about the supply voltage $V_{CC}$, a positive electric charge, and about the reference voltage $V_{SS}$, a negative electric charge, with one of the two conductors comprises energizing a word line coupled to each of the at least two memory cells in the group of memory cells.

80. In a method for a semiconductor device for storing a bit in a memory array having a plurality of memory cells, each of the plurality of memory cells coupled to one of a pair of complementary digit lines in the semiconductor device, the method comprising:

applying a charge representing the bit on each of the one of a pair of complementary digit lines by applying one of about the supply voltage $V_{CC}$, a positive electric charge, and about the reference voltage $V_{SS}$, a negative electric charge;

storing the charge of one of about the supply voltage $V_{CC}$, a positive electric charge, and about the reference voltage $V_{SS}$, a negative electric charge, provided on the one of a pair of complementary digit lines in one of the plurality of memory cells; and storing the charge provided on the one of a pair of complementary digit lines in another memory cell of the plurality of memory cells to store a charge representing a single stored bit of one of about the supply voltage $V_{CC}$, a positive electric charge, and about the reference voltage $V_{SS}$, a negative electric charge, and for directing each memory cell in the plurality of memory cells to share its stored charge with the one of a pair of complementary digit lines when the single stored bit for accessing one of about the supply voltage $V_{CC}$, a positive electric charge, and about the reference voltage $V_{SS}$, a negative electric charge.

81. In a method for operating a semiconductor device having a memory array to store a bit by storing a charge in a memory cell, the memory array also being of a type to access the bit by sharing the stored charge with one of two conductors and detecting a resulting change in voltage between the two conductors, the method comprising:

causing the memory cell in a group of at least two memory cells in the memory array to each store the same bit by each storing a charge representing the bit by storing about the supply voltage $V_{CC}$, a positive electric charge, and about the reference voltage $V_{SS}$, a negative electric charge;

causing each memory cell in the group of at least two memory cells to share its stored charge of about the supply voltage $V_{CC}$, a positive electric charge, and about the reference voltage $V_{SS}$, a negative electric charge, with one of the two conductors; and attempting to detect the change in voltage between the two conductors resulting from the group of at least two memory cells sharing their stored charges of one of about the supply voltage $V_{CC}$, a positive electric charge, and about the reference voltage $V_{SS}$, a negative electric charge, with the two conductors.

82. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting the change in voltage on one of the two conductors, the method comprising:

causing the at least two memory cells in a group of memory cells in the memory array to each store the same bit by each storing a charge representing the bit by storing about the supply voltage $V_{CC}$; and directing each of the at least two memory cells in the group of memory cells to share its stored charge with one of the two conductors for accessing the stored bit as one of about the supply voltage $V_{CC}$.

83. The method of claim 82, wherein causing the at least two memory cells in the group of memory cells to each store the same bit of one of about the supply voltage $V_{CC}$ by each storing a charge representing the bit comprises energizing a word line coupled to each of the at least two memory cells in the group of memory cells.

84. The method of claim 82, wherein directing each of the at least two memory cells in the group of memory cells to share its stored charge of one of about the supply voltage $V_{CC}$ with one of the two conductors comprises energizing a word line coupled to each of the at least two memory cells in the group of memory cells.

85. In a method for a semiconductor device for storing a bit in a memory array having a plurality of memory cells, each of the plurality of memory cells coupled to one of a pair of complementary digit lines in the semiconductor device, the method comprising:

applying a charge representing the bit on each of the one of a pair of complementary digit lines by applying one of about the supply voltage $V_{CC}$;

storing the charge of one of about the supply voltage $V_{CC}$ provided on the one of a pair of complementary digit lines in one of the plurality of memory cells; and storing the charge provided on the one of a pair of complementary digit lines in another memory cell of the plurality of memory cells to store a charge representing a single stored bit of one of about the supply voltage $V_{CC}$ and for directing each memory cell in the plurality of memory cells to share its stored charge with the one of a pair of a complementary digit line pairs when the single stored bit for accessing one of about the supply voltage $V_{CC}$.

86. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting the change in voltage on one of the two conductors, the method comprising:

causing the at least two memory cells in a group of memory cells in the memory array to each store the same bit by each storing a charge representing the bit by storing one of about the supply voltage $V_{CC}$; and directing each of the at least two memory cells in the group of memory cells to share its stored charge with one of the two conductors for accessing the stored bit as one of about the supply voltage $V_{CC}$ and a positive electric charge.

87. In a method for operating a semiconductor device having a memory array to store a bit by storing a charge in a memory cell, the memory array also being of a type to access the bit by sharing the stored charge with one of two conductors and detecting a resulting change in voltage between the two conductors, the method comprising:

causing the memory cell in a group of at least two memory cells in the memory array to each store the same bit by each storing a charge representing the bit by storing about the supply voltage $V_{CC}$;

causing each memory cell in the group of at least two memory cells to share its stored charge of about the supply voltage $V_{CC}$ with one of the two conductors; and attempting to detect the change in voltage between the two conductors resulting from the group of at least two memory cells sharing their stored charges of one of about the supply voltage $V_{CC}$ with the two conductors.

88. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting the change in voltage on one of the two conductors, the method comprising:

causing the at least two memory cells in a group of memory cells in the memory array to each store the same bit by each storing a charge representing the bit by storing about the reference voltage $V_{SS}$; and directing each of the at least two memory cells in the group of memory cells to share its stored charge with one of the two conductors for accessing the stored bit as about the reference voltage $V_{SS}$.

89. The method of claim 88, wherein causing the at least two memory cells in the group of memory cells to each store the same bit of about the reference voltage $V_{SS}$ by each storing a charge representing the bit comprises energizing a word line coupled to each of the at least two memory cells in the group of memory cells.

90. The method of claim 88, wherein directing each of the at least two memory cells in the group of memory cells to share its stored charge of about the reference voltage $V_{SS}$ with one of the two conductors comprises energizing a word line coupled to each of the at least two memory cells in the group of memory cells.

91. In a method for a semiconductor device for storing a bit in a memory array having a plurality of memory cells, each of the plurality of memory cells coupled to one of a pair of complementary digit lines in the semiconductor device, the method comprising:

applying a charge representing the bit on each of the one of a pair of complementary digit lines by applying about the reference voltage $V_{SS}$;

storing the charge of about the reference voltage $V_{SS}$ provided on the one of a pair of complementary digit lines in one of the plurality of memory cells; and storing the charge provided on the one of a pair of complementary digit lines in another memory cell of the plurality of memory cells to store a charge representing a single stored bit of about the reference voltage $V_{SS}$ and for directing each memory cell in the plurality of memory cells to share its stored charge with the one of a pair of complementary digit line pairs when the single stored bit for accessing about the reference voltage $V_{SS}$.

92. In a method for operating a semiconductor device having a memory array to store a bit by storing a charge in a memory cell, the memory array also being of the type to access the bit by sharing the stored charge with one of two conductors and detecting a resulting change in voltage between the two conductors, the method comprising:

causing the memory cell in a group of at least two memory cells in the memory array to each store the same bit by each storing a charge representing the bit by storing about the reference voltage $V_{SS}$;

causing each memory cell in the group of at least two memory cells to share its stored charge of about the reference voltage $V_{SS}$ with one of the two conductors; and attempting to detect a change in voltage between the two conductors resulting from the group of at least two memory cells sharing their stored charges of the reference voltage $V_{SS}$ with the two conductors.

93. In a method for a semiconductor device having a memory array for storing a bit by storing a charge in at least two memory cells, the memory array accessing the bit by sharing the stored charge with one of two conductors and detecting a resulting change in voltage between the two conductors, the memory array storing the bit in the at least two memory cells for detecting the change in voltage on one of the two conductors, the method comprising:

causing the at least two memory cells in a group of memory cells in the memory array to each store the same bit by each storing a charge representing the bit by storing one of about the supply voltage $V_{CC}$ and about the reference voltage $V_{SS}$; and directing each of the at least two memory cells in the group of memory cells to share its stored charge with one of the two conductors connected to a terminal of each memory cell of the at least two memory cells for accessing the stored bit as of one of about the supply voltage $V_{CC}$ and about the reference voltage $V_{SS}$.

94. The method of claim 93, wherein causing the at least two memory cells in the group of memory cells to each store the same bit of one of about the supply voltage $V_{CC}$ and about the reference voltage $V_{SS}$ by each storing a charge representing the bit comprises energizing a word line coupled to each of the at least two memory cells in the group of memory cells.

95. The method of claim 93, wherein directing each of the at least two memory cells in the group of memory cells to share its stored charge of one of about the supply voltage $V_{CC}$ and about the reference voltage $V_{SS}$ with one of the two conductors comprises energizing a word line coupled to each of the at least two memory cells in the group of memory cells.

96. In a method for a semiconductor device for storing a bit in a memory array having a plurality of memory cells, each of the plurality of memory cells coupled to one of a pair of complementary digit lines in the semiconductor device, the method comprising:

applying a charge representing the bit on each of the one of a pair of complementary digit lines by applying one of about the supply voltage $V_{CC}$ and about the reference voltage $V_{SS}$;

storing the charge of one of about the supply voltage $V_{CC}$, a positive electric charge, and about the reference voltage $V_{SS}$, a negative electric charge, provided on the one of a pair of complementary digit lines in one of the plurality of memory cells to a terminal of at least two memory cells of the plurality of memory cells; and storing the charge provided on the one of a pair of complementary digit lines in another memory cell of the plurality of memory cells to store a charge representing a single stored bit of one of about the supply voltage $V_{CC}$ and about the reference voltage $V_{SS}$ and for directing each memory cell in the plurality of memory cells to share its stored charge with one of the two conductors when the single stored bit for accessing one of about the supply voltage $V_{CC}$ and about the reference voltage $V_{SS}$.

97. In a method for operating a semiconductor device having a memory array to store a bit by storing a charge in a memory cell, the memory array also being of the type to access the bit by sharing the stored charge with one of two conductors connected to a terminal of at least two memory cells and detecting a resulting change in voltage between the two conductors, the method comprising:

causing the memory cell in a group of at least two memory cells in the memory array to each store the same bit by each storing a charge representing the bit by storing about the supply voltage $V_{CC}$ and about the reference voltage $V_{SS}$;

causing each memory cell in the group of at least two memory cells to share its stored charge of about the supply voltage $V_{CC}$ and about the reference voltage $V_{SS}$; and attempting to detect a change in voltage between the two conductors resulting from the group of at least two memory cells sharing their stored charges of one of about the supply voltage $V_{CC}$ and about the reference voltage $V_{SS}$ with the two conductors.

* * * * *